(12) United States Patent
Takehisa et al.

(10) Patent No.: US 7,796,343 B2
(45) Date of Patent: Sep. 14, 2010

(54) PHOTOMASK INSPECTION APPARATUS

(75) Inventors: Kiwamu Takehisa, Kanagawa (JP);
Haruhiko Kusunose, Kanagawa (JP);
Naoki Awamura, Kanagawa (JP)

(73) Assignee: Lasertec Corporation, Kanagawa (JP)

( * ) Notice: Subject to any disclaimer, the term of this patent is extended or adjusted under 35 U.S.C. 154(b) by 277 days.

(21) Appl. No.: 11/964,318

(22) Filed: Dec. 26, 2007

(65) Prior Publication Data

US 2009/0168191 A1  Jul. 2, 2009

(51) Int. Cl.
G02B 3/00 (2006.01)
G02B 9/00 (2006.01)
G02B 1/06 (2006.01)
G02B 3/12 (2006.01)
G01N 21/00 (2006.01)

(52) U.S. Cl. ............ 359/649; 359/665; 356/237.5

(58) Field of Classification Search ............ 359/649, 359/642, 665–667; 356/237.1–237.5; 355/67, 355/91, 125

See application file for complete search history.

(56) References Cited

U.S. PATENT DOCUMENTS 5,900,354 A * 5/1999 Batchelder ............ 430/395

FOREIGN PATENT DOCUMENTS

| JP | 2005-083800 A | 3/2005 |
| JP | 2005-338027 A | 12/2005 |
| JP | 2006-073970 A | 3/2006 |
| JP | 2006-171186 A | 6/2006 |

OTHER PUBLICATIONS

Broadbent, et al., "Results from a new die-to-database reticle inspection platform", Proceedings of SPIE, 2004, pp. 265-278, vol. 5446, Bellingham, WA, USA.
Fujiwara, et al., "Advanced Mask Inspection Method Using Deep UV Reflected Light Source", Toshiba Review, 2003, , pp. 58-61, vol. 58, No. 7, Japan.
Sakuma, et al., "CW DUV light sources for inspection tools", Proceedings of SPIE, 2005, p. 43-1-43-8, vol. 5992.
Narusawa, Makoto. "Have all technical problems been solved for the actual use of ArF liquid immersion lithography device that will be finally unveiled?" Electric Journal, May 2004 pp. 73-74, Japan.

* cited by examiner

*Primary Examiner*—Alicia M Harrington
(74) *Attorney, Agent, or Firm*—Sughrue Mion, PLLC

(57) ABSTRACT

According to one aspect of the present invention, there is provided a photomask inspection apparatus which observes a pattern provided on a mask substrate of a mask to inspect the mask including an object lens, and a liquid that is present between a last lens in the side closer to the mask of the object lens and the mask.

14 Claims, 26 Drawing Sheets

RELATED ART

WHEN THE MASK IS SCANNED
(PURE WATER IS DISCHARGED FROM ONLY THE PURE WATER SUPPLY PORT 222a)

WHEN THE MASK IS STOPPED
(PURE WATER IS DISCHARGED FROM ONLY THE PURE WATER SUPPLY PORT 222a)

WHEN THE MASK IS STOPPED
(PURE WATER IS DISCHARGED FROM THE PURE WATER SUPPLY PORT 222a-222d)

PHOTOMASK INSPECTION APPARATUS

BACKGROUND OF THE INVENTION

1. Field of the Invention

The present invention relates to a photomask inspection apparatus for inspecting photomasks (or also called reticles but herein simply called masks) used in a semiconductor manufacturing process.

2. Description of Related Art

Generally, there are widely known two mask defect inspecting method: an inspection method which compares a mask pattern and design data (generally called a die-to-database comparing method) and an inspection method which compares two mask patterns (generally called a die-to-die comparing method). In either of these inspection methods, an image of a mask pattern is detected with a microscope. At this time, if an optical microscope is used, the mask pattern needs to be illuminated with light. For the light source (i.e., a mask inspection light source), there are two main categories: the use of a lamp and the use of a laser. In photomask inspection apparatuses using a laser, a continuous laser that generates continuous laser light is usually used.

At present, photomask inspection apparatuses using continuous laser light of 257 nm in wavelength (the second harmonic of the wavelength of 514 nm that is the maximum output line of an argon laser) as the inspection light source laser are available in the market, which are described in, e.g., Proceedings of SPIE, vol. 5446, pp. 265-278, 2004 or Toshiba Review, vol. 58, No. 7, pp. 58-61, 2003.

As feature sizes of semiconductor devices become finer, patterns on the masks become finer. Accordingly, for improved sensitivity in detecting defects, there is a demand for use of a shorter wavelength for the light sources of photomask inspection apparatuses as well. The mask inspection light source of the next generation is required to be a light source having a wavelength of 200 nm or less. For example, a photomask inspection apparatus has been developed which has generated therein ultraviolet laser light having a wavelength of 198.5 nm that is the summation frequency of the frequencies of the second harmonic of an argon laser of 488 nm in wavelength and a fiber laser of 1064 nm in wavelength to use as the mask inspection light. Such a photomask inspection apparatus is disclosed in, e.g., Japanese Unexamined Patent Application Publication No. 2006-73970 or Proceedings of SPIE vol. 5992, pp. 43-1-43-8, 2005.

In the structure of typical KrF or ArF lithography masks used in the semiconductor manufacturing process, one face of a mask substrate 801 made of synthetic quartz is a pattern surface 802 like a mask 810 shown in FIG. 13. Spacer 803a, 803b are provided on the periphery of the mask substrate 801. A pellicle 804, a transparent thin film, is applied onto the spacer 803a, 803b so that the pattern surface 802 is kept in a sealed space, thereby preventing dust outside the mask 810 from sticking to the pattern surface 802. Because the pellicle 804 is formed of an extremely thin polymer of about 1 µm in thickness, there is the problem that the pellicle is easy to be torn.

FIG. 14 shows the usual configuration of a conventional photomask inspection apparatus. As shown in FIG. 14, the conventional photomask inspection apparatus 800 observes an observed area in the pattern surface 802 with an object lens 807 placed directly above the pellicle 804 of the mask 810. Laser light L81 as illuminating light is reflected downward by a polarization beam splitter 805, passes through a quarter wavelength plate 806 to be converted to circular polarization, passes through the object lens 807, and is irradiated onto the observed area in the pattern surface 802. The illuminated observed area in the pattern surface 802 is enlarged by the object lens 807 and a projection lens 808 and projected onto a two-dimensional sensor 809. The way that illuminating light is made incident from the object lens 807 side is called reflected illumination. Meanwhile, the way that the pattern surface 802 is illuminated from the opposite side thereof from the object lens 807 is called transmitted illumination.

In the lithography technology of the semiconductor manufacturing technology, an ArF excimer laser of 193.4 nm in wavelength is widely used as the light source for exposure. An exposure technique using this is called ArF lithography. As lithography technology for realizing even finer feature sizes, an exposure technique called liquid immersion where the gap between the projection lens of an exposure apparatus and a wafer is filled with water is becoming widely used. This is also called ArF liquid immersion exposure, ArF liquid immersion, or the like. FIG. 15 shows the usual configuration of a conventional liquid immersion exposure apparatus. As shown in FIG. 15, in a liquid immersion exposure apparatus 900, the gap between a lens (not shown) at the lower end of a reduction projection optical system 903 used to project a reduced image of a mask 901 onto a wafer 902 and the wafer 902 is filled with pure water 904.

The wafer 902 is mounted on a wafer stage 905, and with the gap between the wafer 902 and the reduction projection optical system 903 being filled with pure water 904, the wafer 902 moves back and forth. The pure water 904 is supplied from a pure water supply unit 906 and sucked into a pure water sucking unit 907 so as to usually fill the space under the reduction projection optical system 903. The ArF liquid immersion exposure is described in, e.g., Electric Journal, pp. 73-74, May 2004, and an inspection apparatus for wafers or the like using a liquid immersion optical system is described in, e.g., Japanese Unexamined Patent Application Publication No. 2005-83800, No. 2005-338027, and No. 2006-171186.

In order to improve the resolving power, i.e., sensitivity of a photomask inspection apparatus, it is inevitable to use a light source of a shorter wavelength. In the future, even a laser of the above-mentioned wavelength of 198.5 nm will not suffice in sensitivity. Even if an ArF excimer laser of 193.4 nm in wavelength or the like can be used for the mask inspection light source, they will not be enough in sensitivity to inspect a 32-nm generation of masks.

Accordingly, considering the application of the liquid immersion technique to photomask inspection apparatuses as with the exposure technology, the problem below exists, and hence it has been extremely difficult to apply the liquid immersion technique. The reason is that, as seen from the conventional photomask inspection apparatus 800 of FIG. 14, if an attempt is made to apply the liquid immersion technique to photomask inspection, the space between the pattern surface 802 and the object lens 807 will be filled with water, and hence the pellicle 804 cannot be used. Of course, at a stage before applying the pellicle to them in the production process of masks, such liquid immersion technique can be used, but in the photomask inspection where masks finished by applying the pellicle thereto are inspected, the liquid immersion technique cannot be used. There is the problem that in the conventional photomask inspection apparatus, it is difficult to improve the resolution and sensitivity.

An object of the present invention is to provide a photomask inspection apparatus of high resolution.

SUMMARY OF THE INVENTION

According to a first aspect of the present invention, there is provided a photomask inspection apparatus which observes a pattern provided on a mask substrate of a mask to inspect the mask including an object lens, and a liquid that is present between a last lens in the side closer to the mask of the object lens and the mask. By this means, resolution can be improved.

According to a second aspect of the present invention, the object lens is placed on the opposite side of the mask substrate from a pattern surface thereof in the photomask inspection apparatus. By this means, the liquid can be easily removed from the mask.

According to a third aspect of the present invention, the object lens is placed above the mask and is provided with a supply unit to supply the liquid to a non-pattern surface of the mask substrate opposite to the pattern surface and a sucking unit to suck the liquid in the photomask inspection apparatus. By this means, the configuration of the apparatus becomes simple.

According to a fourth aspect of the present invention, the object lens is placed below the mask in the photomask inspection apparatus. By this means, the configuration of the apparatus becomes simple.

According to a fifth aspect of the present invention, the object lens has an outlet to supply the liquid, and the outlet is provided upstream in a scan direction in the photomask inspection apparatus. By this means, the configuration of the apparatus becomes simple.

According to a sixth aspect of the present invention, a plurality of the outlets are provided at least upstream and downstream in the scan direction, and the object lens has a notch to drain the liquid in a direction perpendicular to the scan direction in the photomask inspection apparatus. By this means, the configuration of the apparatus becomes simple.

According to a seventh aspect of the present invention, the object lens has an inlet surrounding the outlet to suck in the liquid in the photomask inspection apparatus. By this means, the configuration of the apparatus becomes simple.

According to an eighth aspect of the present invention, the object lens has a gas outlet surrounding the inlet to discharge gas in the photomask inspection apparatus. By this means, the configuration of the apparatus becomes simple.

According to a ninth aspect of the present invention, there is provided the photomask inspection apparatus further including a container to contain the liquid, wherein the mask is placed in the container so that a surface of the mask opposite to a pattern surface thereof is in contact with the liquid. By this means, the masks can be observed stably.

According to a tenth aspect of the present invention, there is provided the photomask inspection apparatus further including a measuring unit for measuring the distance to the pattern surface of the mask in the container, the pattern surface facing upwards, and the object lens is placed below the container. By this means, even if variation in thickness between masks exists, the masks can be observed stably.

According to an eleventh aspect of the present invention, the mask is a mask with a pellicle in the photomask inspection apparatus. Therefore, the mask with the pellicle can be observed with high resolution.

According to a twelfth aspect of the present invention, the mask is an imprint mask in the photomask inspection apparatus. Therefore, the imprint mask can be observed with high resolution.

According to a thirteenth aspect of the present invention, there is provided the photomask inspection apparatus further including a support to hold the mask, wherein a step corresponding in outline to the support is formed in the top of a body of the object lens. By this means, when the object lens is located at an edge of a mask, a claw of an arm holding the mask from below can be received in the step.

According to a fourteenth aspect of the present invention, two of the steps are formed respectively in opposite sides of the top of the body of the object lens in the photomask inspection apparatus. By this means, when the object lens is located at either of opposite edge sides of a mask, a claw of an arm holding the mask from below can be received in the step.

According to a fifteenth aspect of the present invention, the step is formed throughout the periphery of the top of the body of the object lens in the photomask inspection apparatus. By this means, when the object lens is located at any of four edge sides of a mask, a claw of an arm holding the mask from below can be received in the step.

According to a sixteenth aspect of the present invention, a mask scan direction during inspection of the mask is parallel to a longitudinal direction of a maximum pattern area of the mask in the photomask inspection apparatus. By this means, distances between edges of the pattern area and edge sides of the mask are long, and hence the object lens does not interfere with the support holding the mask.

According to a seventeenth aspect of the present invention, the object lens is rotatably held so that when the mask and the object lens moves relatively to each other, the orientation of the object lens around its optical axis can be changed according to the direction of the movement. By this means, even if there is only one outlet, the outlet can always be placed upstream in a scan direction, and hence the structure for the supply and suction of pure water for the object lens can be simplified.

According to an eighteenth aspect of the present invention, there is provided the photomask inspection apparatus further including a plane plate positioned adjacent to at least two of four sides of the mask and substantially level with the non-pattern surface of the mask substrate of the mask. By this means, if the liquid flows to an edge of the mask, although it spreads over the plane plate, the liquid can be prevented from flowing around to the pellicle side of the mask.

According to a nineteenth aspect of the present invention, the object lens has a plurality of outlets provided surrounding the last lens, and when the object lens is stationary relative to the mask, the liquid is supplied from the plurality of outlets. By this means, also in review or the like where a mask is stopped, the entire surface of the last lens is covered by the liquid.

According to a twentieth aspect of the present invention, wherein refractive index of the liquid is substantially equal to that of the mask substrate in the inspection apparatus.

According to the present invention, a photomask inspection apparatus of high resolution can be provided.

The above and other objects, features and advantages of the present invention will become more fully understood from the detailed description given hereinbelow and the accompanying drawings which are given by way of illustration only, and thus are not to be considered as limiting the present invention.

DETAILED DESCRIPTION OF THE PREFERRED EMBODIMENTS

Figure 1:
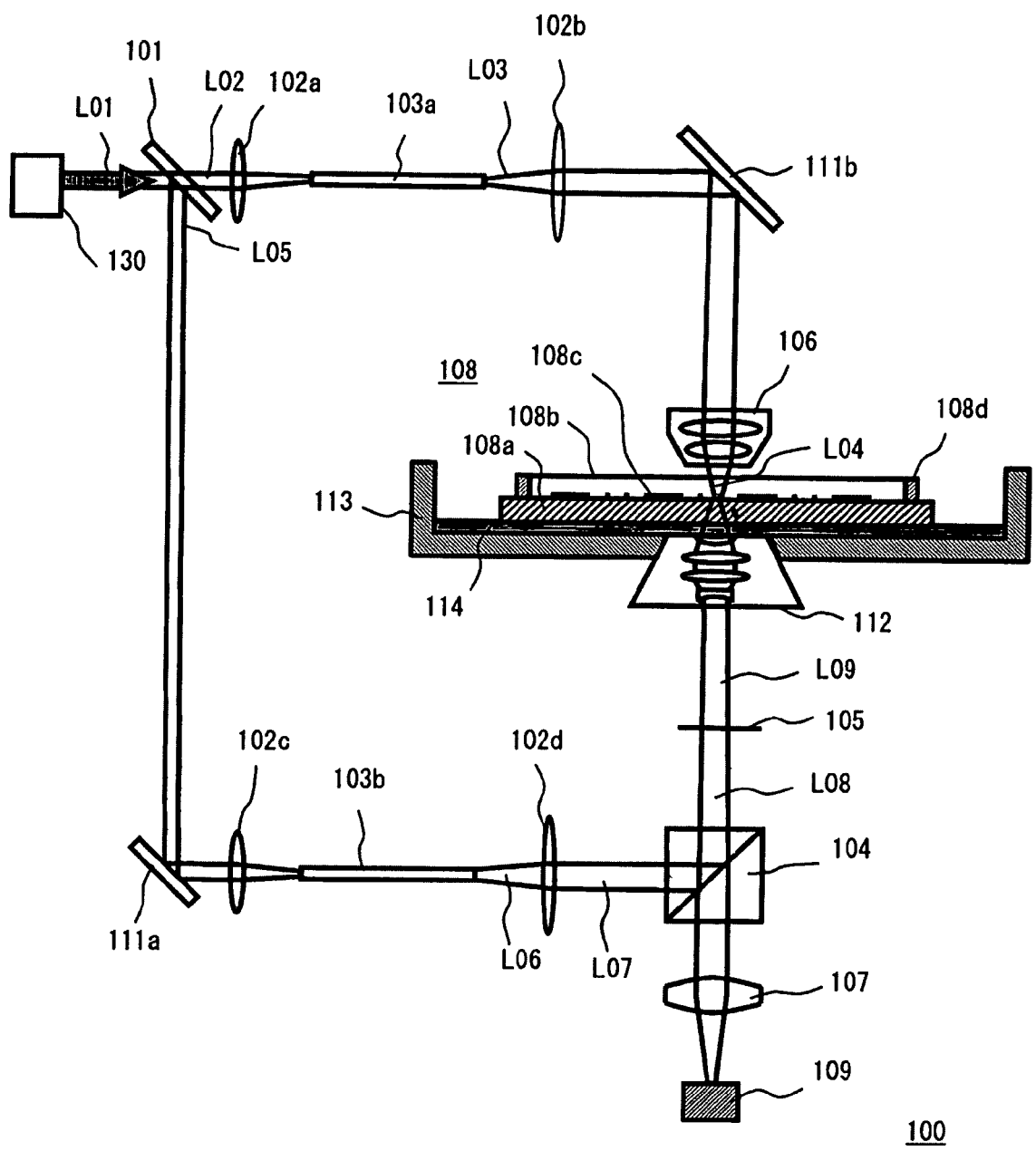
FIG. 1 shows the configuration of a photomask inspection apparatus according to embodiment 1.

Embodiments of the present invention will be described below with reference to the drawings. The description below will be made to present preferred embodiments of the present invention, and the invention is not intended to be limited in scope to the embodiments below. The same reference numerals indicate substantially the same parts.

Embodiment 1

A photomask inspection apparatus according to embodiment 1 of the present invention will be described with reference to FIG. 1. FIG. 1 shows the configuration of a photomask inspection apparatus 100 according to the present embodiment. As shown in FIG. 1, the photomask inspection apparatus 100 comprises an inspection light source 130, a half mirror 101, lenses 102a to 102d, homogenizing optical systems 103a, 103b, a polarization beam splitter 104, a quarter wavelength plate 105, a condenser lens 106, a projection lens 107, a two-dimensional photosensor 109, mirrors 111a, 111b, an object lens 112, a water bath 113, and pure water 114. The photomask inspection apparatus 100 according to the present embodiment is for inspecting a finished mask 108 comprising a frame 108d provided so as to surround a pattern surface 108c formed on a mask substrate 108a and a pellicle 108b applied to this. In this embodiment, synthetic quartz of about 1.5608 in refractive index is used as the mask substrate 108a.

The photomask inspection apparatus 100 uses laser light L01 of 193 nm in wavelength from the inspection light source 130 for illumination. The laser light L01 is incident on the half mirror 101 and divided into lights in two directions. One of the divided laser lights is used as transmitted illumination light and the other is used as reflected illumination light.

First, the transmitted illumination will be described. Laser light L02 that has passed through the half mirror 101 travels through the lens 102a with converging and is incident on the homogenizing optical system 103a. The homogenizing optical system 103a is, for example, a fiber bundle that is a bundle of fibers. Laser light L03 homogenized in spatial light intensity distribution is output by the homogenizing optical system 103a and passes through the lens 102b to be collimated and is deflected by the mirror 111b to be incident on the condenser lens 106, which condenses it into laser light L04. The laser light L04 illuminates an observed area in the pattern surface 108c of the mask 108. The condenser lens 106 is placed directly above the pellicle 108b of the mask 108.

Next, the reflected illumination will be described. Laser light L05 that has been reflected by the half mirror 101 is reflected by the mirror 111a and passes through the lens 102c to be incident on the homogenizing optical system 103b. Laser light L06 homogenized in spatial light intensity distribution is output by the homogenizing optical system 103b, passes through the lens 102d to be collimated, and is incident on the polarization beam splitter 104. Because it is S waves, laser light L07 is reflected by the polarization beam splitter 104 and travels upward as indicated by laser light L08. The laser light L08 passes through the quarter wavelength plate 105 to be circularly polarized into laser light L09. The laser light L09 is incident on the object lens 112 fixed in the middle of the water bath 113 and passes through the pure water 114 and the mask substrate 108a of the mask 108 and illuminates the pattern surface 108c from below. The water bath 113 is a container containing the pure water 114.

An optical system for observing an observed area in the pattern surface 108c of the mask 108 will be described below. Laser light L09 imparted with an optical image originating from an observed area in the pattern surface 108c illuminated by the transmitted illumination or the reflected illumination is output downward from the object lens 112, which laser light contains optical information in the form of a spatial light intensity distribution. This laser light L09 comprises reflected light reflected by the mask 108 and transmitted light transmitted by the mask 108. The laser light L09 reflected by the mask 108 is circularly polarized in a direction opposite to that of the laser light L09 incident on the mask 108 and hence, passing through the quarter wavelength plate 105 again, becomes here P waves. Thus, the reflected light from the pattern surface 108c of the mask 108 passes through the polarization beam splitter 104. As a result, the reflected light passes through the projection lens 107 and strikes the two-dimensional photosensor 109. That is, an image of the observed area in the pattern surface 108c is enlarged by the ratio of the focal distance of the projection lens 107 to the focal distance of the object lens 112 and enlargement projected onto the two-dimensional photosensor 109. The laser light L09 that has passed through the mask 108 is also output from the object lens 112 and passes through the same optical path to be incident on the two-dimensional photosensor 109.

In the photomask inspection apparatus 100 according to the present embodiment, the water bath 113 contains the pure water 114. The mask 108 is placed in the water bath 113 such that the surface of the mask substrate 108a opposite to the pattern surface 108c contacts the pure water 114 contained therein. The object lens 112 is placed on the opposite side of the mask 108 from the pattern surface 108c. That is, the object lens 112 is placed under the surface of the mask substrate 108a opposite to the pattern surface 108c, and the space between the object lens 112 and the mask substrate 108a is filled with the pure water 114. The object lens 112 includes multiple lenses. The space between a last lens on the mask 108 side included in the object lens 112 and the mask substrate 108a is filled with the pure water 114. Thus, an air layer is not formed between the pattern surface 108c and the object lens 112. By this means, only the pure water 114 of about 1.44 in refractive index and the mask substrate 108a of about 1.56 in refractive index are sandwiched between the pattern surface 108c and the object lens 112. As such, according to the present invention, the liquid immersion technique can be applied to photomask inspection as well.

In the present embodiment, because the pattern surface 108c observed is on a quartz substrate, the sensitivity can be raised to as high a level as when inspected with a light source having a wavelength equal to the wavelength of that inspection light source divided by the refractive index of synthetic quartz. For example, for a light source wavelength of 193 nm, because the refractive index of synthetic quartz is about 1.5608, sensitivity of the same level as when inspected with a light source of a minimum of about 124 nm in wavelength is obtained. In reality, depending on the refractive index of liquid in use, with water having a refractive index of 1.436 at a wavelength of 193 nm, sensitivity is of the same level as when inspected with a light source of 134 nm in wavelength. By this means, the resolution can be increased by a factor of about 1.56, which equals the index of the synthetic quartz in contact with the pattern surface 108c, as compared with the conventional apparatus using an inspection light source of the same wavelength.

If a xenon mercury lamp of 248 nm is used, because the refractive index of synthetic quartz is 1.5086 at a wavelength of 248 nm, resolution of substantially the same level as when using a light source of 164 nm in wavelength will be obtained by applying the present invention.

Because during inspection the mask 108 can freely move along a plane in the water bath 113, the center and around it of the object lens 112 can be positioned opposite every part of the pattern surface 108c. By this means, the almost entire mask 108 can be observed. Further, the water bath 113 may be sealed to the object lens 112, thereby preventing the leakage of the pure water 114. The sealing material can be an elastic substance such as rubber.

In the present invention, where the object lens 112 is placed below the mask 108, if the object lens 112 is large, it may be difficult to support the mask substrate 108a from below, in which case the mask substrate 108a may be held by vacuum suction from above at the outside of the pellicle 108b.

In the present embodiment, the object lens 112 has its focal distance of about 3 mm. Meanwhile, the focal distance of the projection lens 107 is about 300 mm. As a result, an image of part of the pattern surface 108c is enlarged by a factor of about 100 and projected onto the two-dimensional photosensor 109. A CCD, a TDI, or the like is suitable as the two-dimensional photosensor 109.

Embodiment 2

Figure 2:
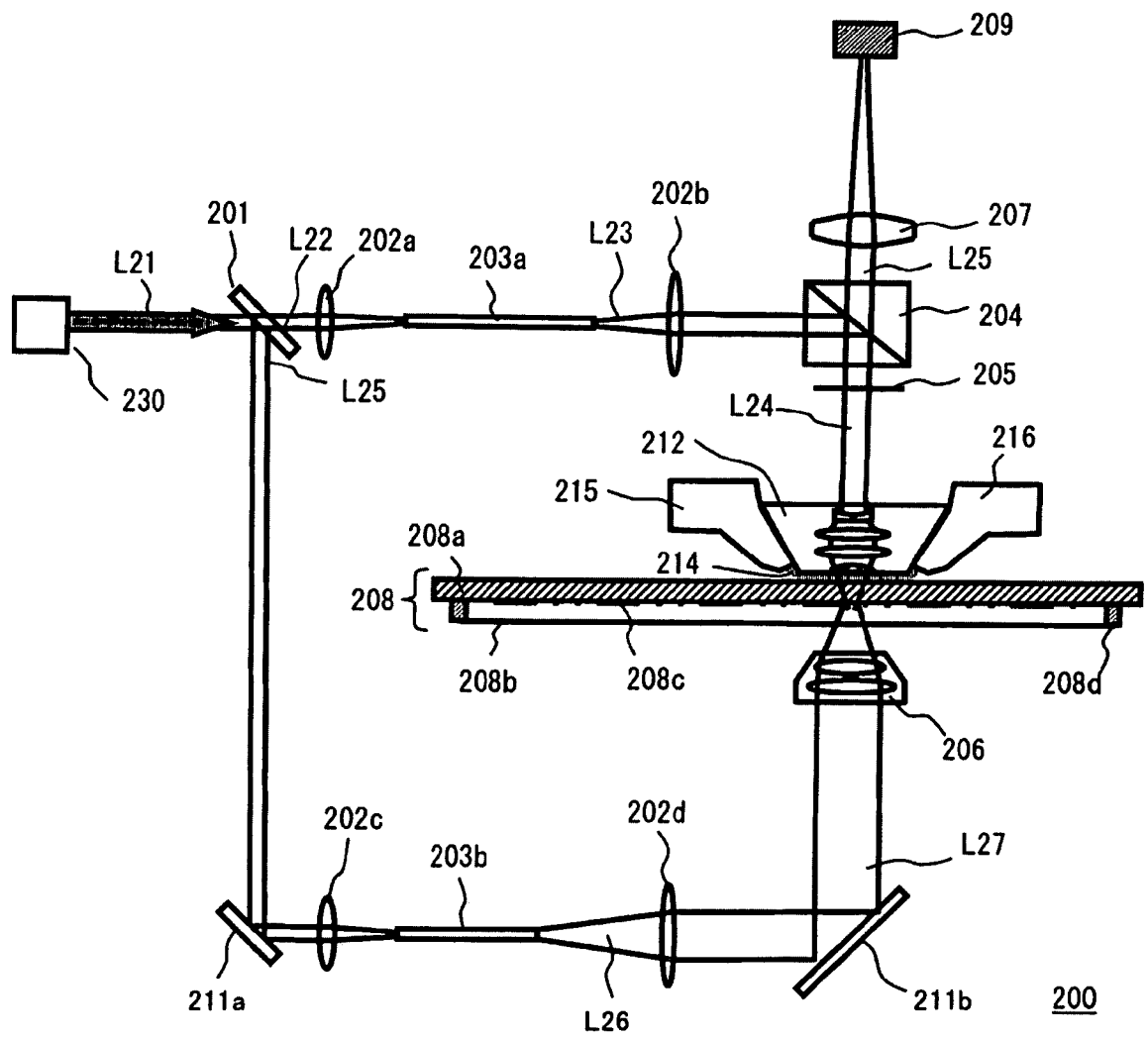
FIG. 2 shows the configuration of a photomask inspection apparatus according to embodiment 2.

A photomask inspection apparatus according to embodiment 2 of the present invention will be described with reference to FIG. 2. FIG. 2 shows the configuration of a photomask inspection apparatus 200 according to the present embodiment. As shown in FIG. 2, the photomask inspection apparatus 200 comprises an inspection light source 230, a half mirror 201, lenses 202a to 202d, homogenizing optical systems 203a, 203b, a polarization beam splitter 204, a quarter wavelength plate 205, a condenser lens 206, a projection lens 207, a two-dimensional photosensor 209, mirrors 211a, 211b, an object lens 212, pure water 214, a pure water supply unit 215, and a pure water sucking unit 216. Duplicate description with the embodiment 1 will be omitted.

The photomask inspection apparatus 200 according to the present embodiment is also for inspecting a finished mask comprising a frame 208d provided so as to surround a pattern surface 208c formed on a mask substrate 208a and a pellicle 208b applied to this. In this embodiment, synthetic quartz of about 1.5608 in refractive index is used as the mask substrate 208a. The mask 208 is positioned such that the surface of the mask substrate 208a opposite to the pattern surface 208c is the top, and is supported at the outside of the frame 208d.

The photomask inspection apparatus 200 also uses laser light L21 of 193 nm in wavelength for illumination. The laser light L21 is incident on the half mirror 201 and divided into lights in two directions. First, the reflected illumination will be described. Laser light L22 that has passed through the half mirror 201 travels through the lens 202a with converging and is incident on the homogenizing optical system 203a. Laser light L23 homogenized in spatial light intensity distribution is output by the homogenizing optical system 203a and passes through the lens 202b to be collimated and is incident on the polarization beam splitter 204. Because it is S waves, the laser light L23 is reflected by the polarization beam splitter 204, travels downward, and passes through the quarter wavelength plate 205 to be circularly polarized into laser light L24. The laser light L24 is incident on the object lens 212, passes through the pure water 214 and the mask substrate 208a of the mask 208, and illuminates an observed area in the pattern surface 208c.

Next, the transmitted illumination will be described. Laser light L25 that has been reflected by the half mirror 201 is reflected by the mirror 211a and passes through the lens 202c to be incident on the homogenizing optical system 203b. Laser light L26 homogenized in spatial light intensity distribution is output by the homogenizing optical system 203b, passes through the lens 202d to be collimated, is deflected by the mirror 211b to be incident on the condenser lens 206, and illuminates the observed area in the pattern surface 208c of the mask 208. The condenser lens 206 is placed under the pellicle 208b of the mask 208.

An optical system for observing an observed area in the pattern surface 208c of the mask 208 will be described below. Laser light L24 imparted with an optical image originating from the observed area in the pattern surface 208c illuminated by the transmitted illumination or the reflected illumination is output upward from the object lens 212. The laser light L24 comprises reflected light reflected by the mask 208 and transmitted light transmitted by the mask 208. The laser light L24 reflected by the mask 208 is circularly polarized in a direction opposite to that of the laser light L24 for illumination reflected by the polarization beam splitter 204 and hence, passing through the quarter wavelength plate 205 again, becomes linearly polarized waves, here P waves. Thus, the laser light L24 reflected by the mask 208 passes through the polarization beam splitter 204, then passes through the projection lens 207, and strikes the two-dimensional photosensor 209. That is, an image of the observed area in the pattern surface 208c is enlarged by the ratio of the focal distance of the projection lens 207 to the focal distance of the object lens 212 and enlargement projected onto the two-dimensional photosensor 209. A CCD, a TDI, or the like is suitable as the two-dimensional photosensor 209 like in the embodiment 1. The laser light L24 that has passed through the mask 208 is also output from the object lens 212 and passes through the same optical path to be incident on the two-dimensional photosensor 209.

In the photomask inspection apparatus 200 according to the present embodiment, the pure water 214 filling the space between the object lens 212 and the mask substrate 208a is supplied from the pure water supply unit 215 and sucked into the pure water sucking unit 216. This scheme is called "local fill" and has a merit that the water bath 113 in the embodiment 1 is not necessary.

The object lens 212 is placed on the opposite side of the mask 208 from the pattern surface 208c. That is, the object lens 212 is placed directly above the surface of the mask substrate 208a opposite to the pattern surface 208c, and the space between the object lens 212 and the mask substrate 208a is filled with the pure water 214. Thus, an air layer is not formed between the pattern surface 208c and the object lens 212. By this means, only the pure water 214 of about 1.44 in refractive index and the mask substrate 208a of about 1.56 in refractive index are sandwiched between the pattern surface 208c and the object lens 212.

Therefore, as described in the embodiment 1, also in the present embodiment, the sensitivity can be raised to as high a level as when inspected with a light source having a wavelength equal to the wavelength of that inspection light source divided by the refractive index of synthetic quartz. By this means, the resolution can be increased by a factor of about 1.56, which equals the index of the synthetic quartz in contact with the pattern surface 208c, as compared with the conventional apparatus using an inspection light source of the same wavelength.

Embodiment 3

Figure 3:
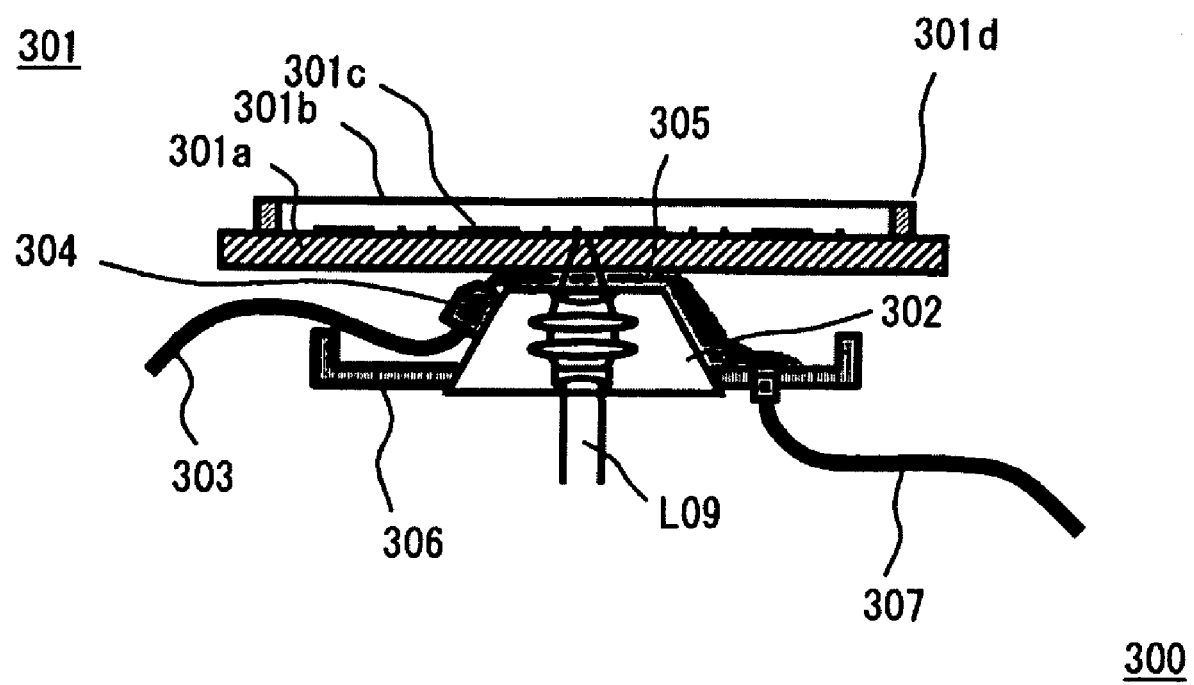
FIG. 3 shows the configuration of part of a photomask inspection apparatus according to embodiment 3.

A photomask inspection apparatus according to embodiment 3 of the present invention will be described with reference to FIG. 3. FIG. 3 shows the configuration of part of a photomask inspection apparatus 300 according to the present embodiment. The present embodiment differs from the embodiment 1 in the liquid immersion part of the photomask inspection apparatus. In FIG. 3, the optical basic configuration is omitted because of being the same as in the embodiment 1 shown in FIG. 1. FIG. 3 shows the configuration of the liquid immersion part of the photomask inspection apparatus 300.

As in the embodiment 1, the photomask inspection apparatus 300 according to the present embodiment is also for inspecting a finished mask comprising a frame 301d provided so as to surround a pattern surface 301c formed on a mask substrate 301a and a pellicle 301b applied to this.

In the present embodiment, the liquid immersion part is configured such that pure water 305 is in contact with the back surface of the mask substrate 301a opposite to the pattern surface 301c. The method of supplying the pure water 305 differs from that of the photomask inspection apparatus 100 of the embodiment 1. As shown in FIG. 3, the pure water 305 is discharged from an outlet 304 attached to an end of a supply tube 303 and fills the space between the top of an object lens 302 and the lower surface of the mask substrate 301a. A tray 306 is attached surrounding the object lens 302 to receive pure water flowing down its side, and the pure water 305 having flowed down the side of the object lens 302 is received by the tray 306 and drained through a drain tube 307 attached to the underside of the tray 306.

The photomask inspection apparatus 300 according to the present embodiment does not need the water bath 113 like the photomask inspection apparatus 100 of FIG. 1. Also, the photomask inspection apparatus 300 differs from the photomask inspection apparatus 200 of FIG. 2 using the local-fill scheme where the object lens 212 is placed above the mask 208 in that the object lens 302 is placed below the mask 301, which is also a local-fill scheme.

In the local-fill scheme where the object lens 212 is placed above the mask 208 as in the photomask inspection apparatus 200 of FIG. 2, in order to retrieve pure water, pure water needs to be sucked up, and all pure water needs to be retrieved so that the pure water does not flow out away, but a sucking device that can reliably perform this was difficult to realize.

In contrast, in the local-fill scheme of the photomask inspection apparatus 300, because the object lens 302 is placed below the liquid immersion part, the pure water 305 that has spread outside the narrow gap of the liquid immersion part flows down naturally without actively sucking pure water. Thus, all the pure water 305 can be retrieved only by putting the tray 306 in place to receive it. As such, by placing the object lens 302 below the liquid immersion part, the inspection apparatus is simply configured.

The mounted position of the outlet 304 relative to the object lens 302 is preferably upstream in a scan direction of the mask 301. By this means, the pure water 305 discharged from the outlet 304 fills the liquid immersion part smoothly by the mask 301 being scanned.

Figure 4A:
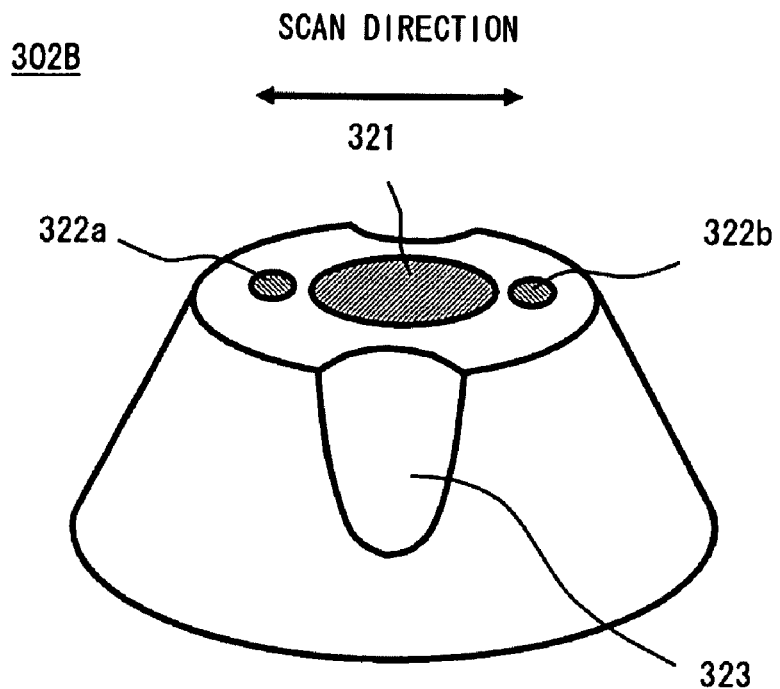
FIG. 4A shows the configuration of another object lens usable in the present invention.
Figure 4B:
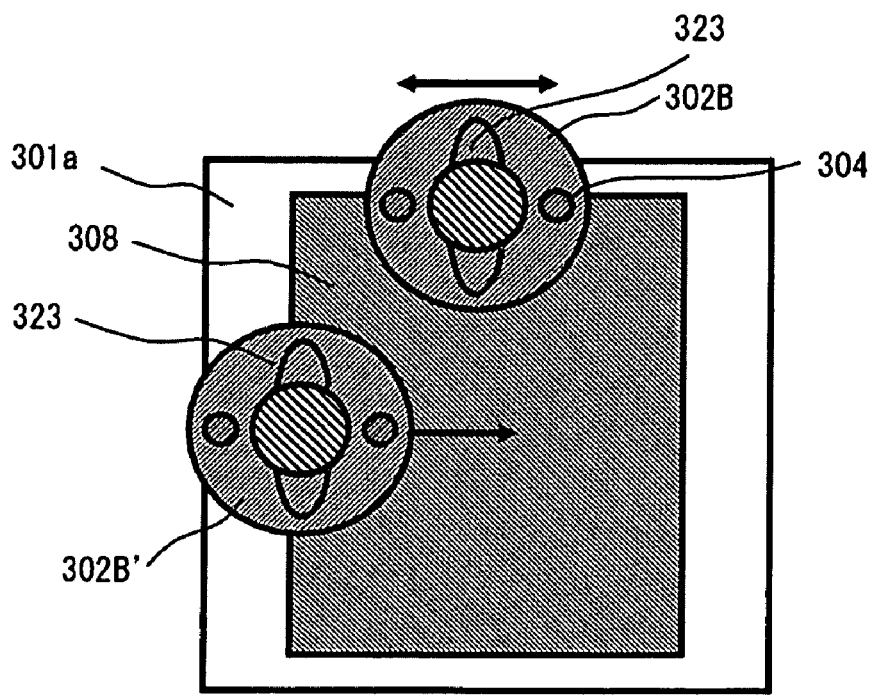
FIG. 4B shows a preferable example of scan using the object lens of FIG. 4A.

FIGS. 4A and 4B illustrates an object lens 302B that differs in the method of supplying pure water from the object lens 302 of the photomask inspection apparatus shown in FIG. 3. FIG. 4A shows the configuration of the object lens 302B, and FIG. 4B shows a preferable example of scan using the object lens 302B. As shown in FIG. 4A, an last lens 321 of the object lens 302B closest to the observed surface is flat. The space between this last lens 321 and the back surface of the mask substrate 301a is filled with pure water. The object lens 302B has circular outlets 322a, 322b for discharging pure water near the last lens 321. The outlets 322a, 322b are placed in a mask scan direction with respect to the last lens 321. That is, the outlets 322a, 322b are placed in parallel to the scan direction.

Since the object lens 302B shown in FIG. 4A is provided with the two outlets 322a, 322b, in whichever of the backward and forward scan directions the mask moves, pure water from one of the outlets 322a, 322b can fill the space between the last lens 321 and the mask substrate without interruption. Pure water to be drained flows out in two directions perpendicular to the scan direction. In order for the pure water to flow down smoothly, gently concaved notches 323 are formed on opposite sides of the object lens 302B. That is, the notches 323 are made in the lens barrel of the object lens and placed along the direction perpendicular to the scan direction. The object lens 302B shown in FIG. 4A may have attached thereto the tray 306 as attached to the object lens 302 of FIG. 3.

Usually, while the shape of the mask substrate is a square having a side of 152 mm, the pattern area is a rectangle having a maximum size of 132 mm×104 mm. Thus, there are narrow and broad areas outside the pattern area on the mask substrate. Thus, where the object lens 302B having the two outlets 304 provided thereon is used, as shown in FIG. 4B, the two outlets 304 may be arranged relative to the center of the object lens 302B to be along the short side direction of the rectangular pattern area 308. By this means, even when the object lens 302B is located under a long side edge of the pattern area 308, the outlets 304 are not outside the mask substrate 301a. Further, even when the object lens 302B is located under a short side edge of the pattern area 308 as indicated by the object lens 302B', the outlets 304 are not outside the mask substrate 301a. Note that arrows on sides of the object lenses 302B, 302B' indicate the movements of the object lenses 302B, 302B' relative to the mask substrate 301a and in reality, the object lens is fixed while the mask is moved in scan.

Figure 5A:
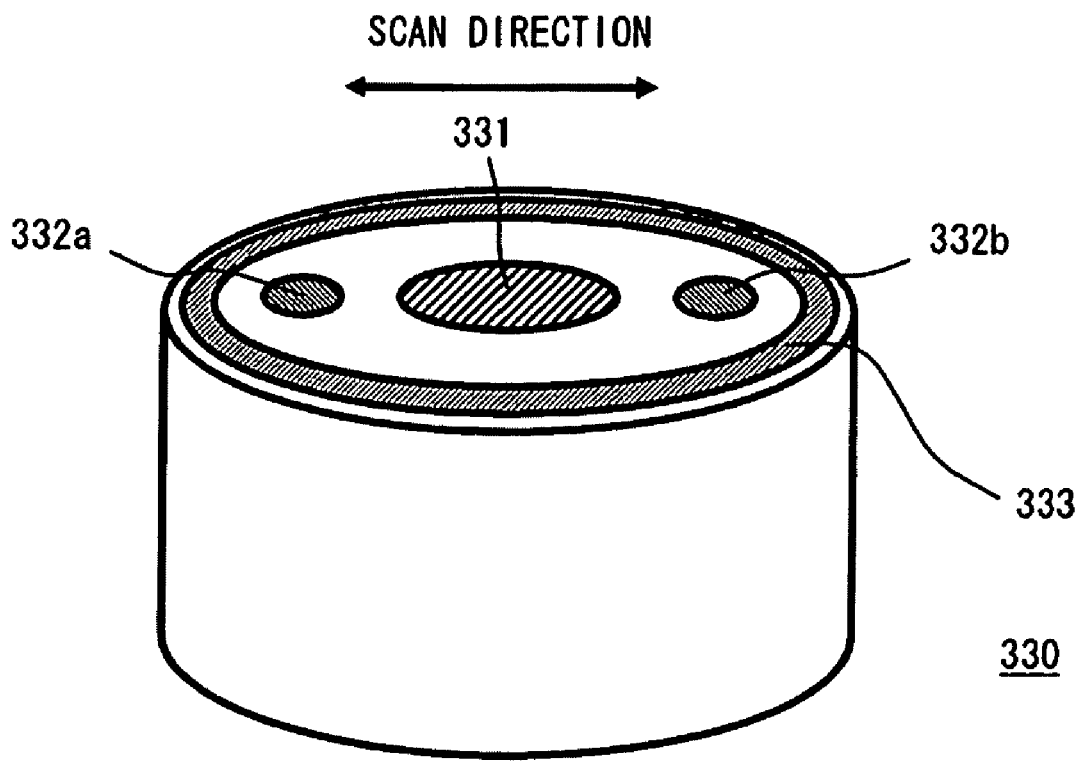
FIGS. 5A and 5B show the configuration of yet another object lens usable in the present invention.
Figure 5B:
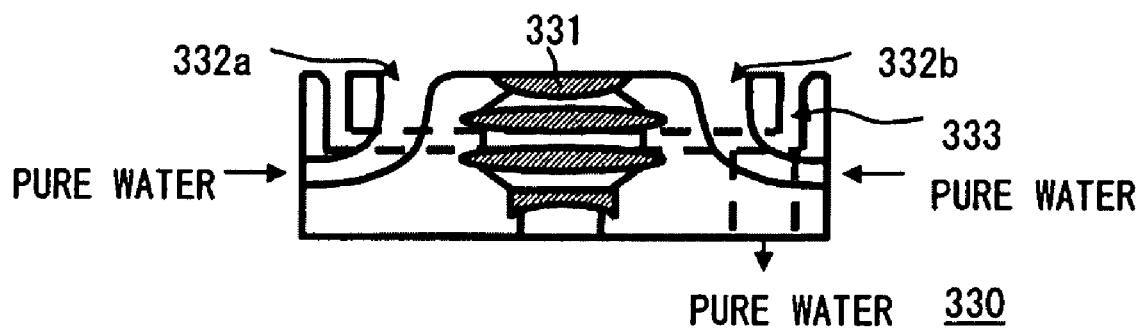

The structure of an object lens 330 of another structure suitable for the photomask inspection apparatus 300 of the present invention will be described with reference to FIGS. 5A and 5B. FIG. 5A is a perspective view of the object lens 330, and FIG. 5B is a sectional view thereof. The object lens 330 is provided at two places with outlets 332a, 332b for discharging pure water like the object lens 302B of FIG. 3, but a pure water inlet 333 is formed like a ring surrounding the two outlets 332a, 332b. By this means, all pure water discharged from the outlets 332a, 332b is sucked through the inlet 333 so as not to flow outside the object lens 330. Hence, the tray 306 as shown in FIG. 3 is not necessary.

Figure 6A:
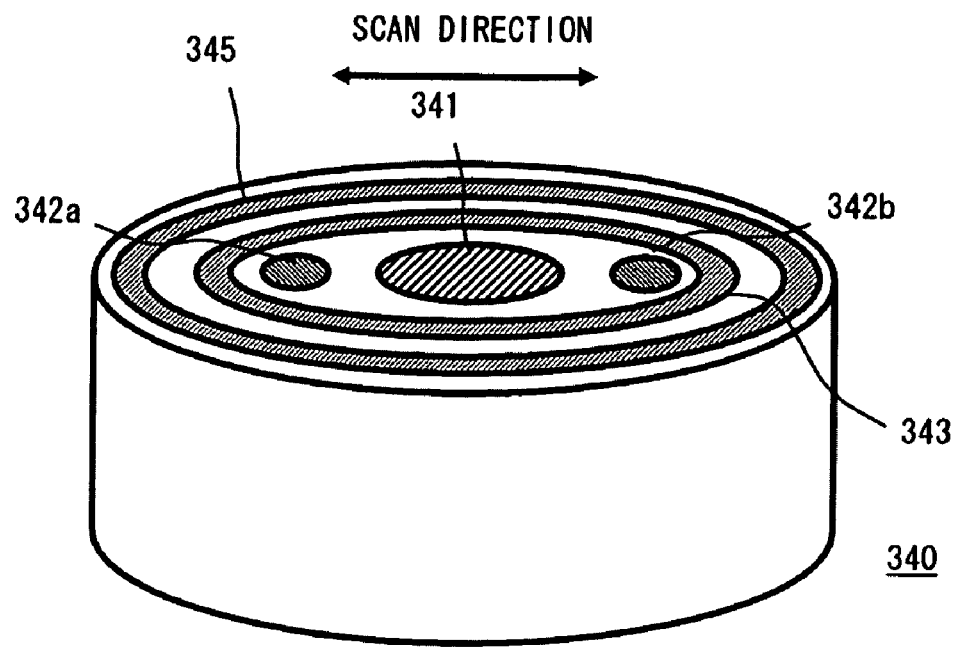
FIGS. 6A and 6B show the configuration of still another object lens usable in the present invention.
Figure 6B:
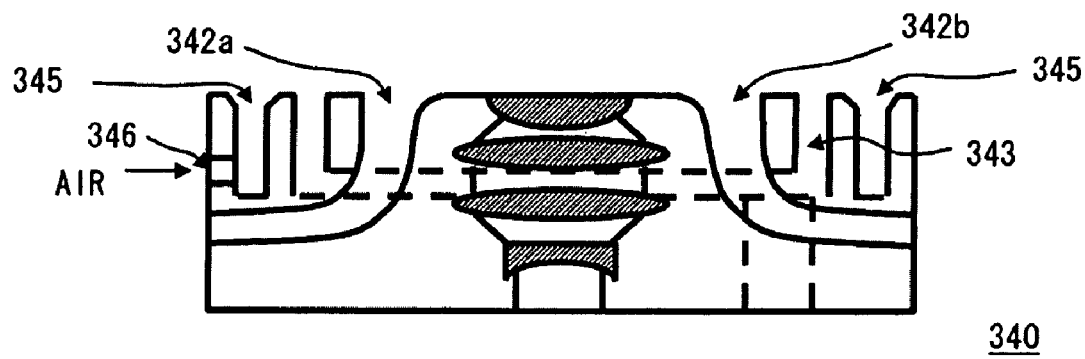

The structure of an object lens 340 of another structure will be described with reference to FIGS. 6A and 6B. FIG. 6A is a perspective view of the object lens 340, and FIG. 6B is a sectional view thereof. The object lens 340 is similar to the object lens 330 of FIG. 5A but differs in that a ring-shaped air outlet 345 is provided around a pure water inlet 343 as shown in FIG. 6A. Further, a tube connection opening 346 is made in the side of the object lens 340, and air is discharged through the air outlet 345. By this means, part of pure water not sucked into the inlet 343 and flowing out can be prevented from flowing outside the object lens 340.

Figure 7A:
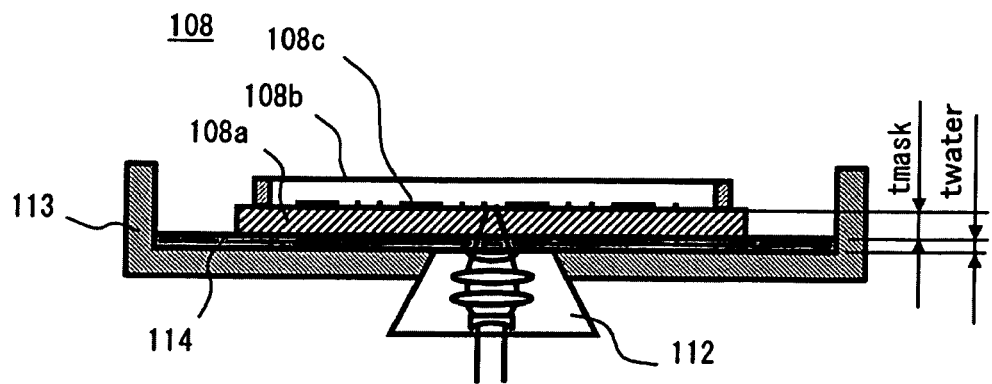
FIGS. 7A, 7B and 7C illustrate the thickness of pure water in the photomask inspection apparatus according to the present invention.
Figure 7B:
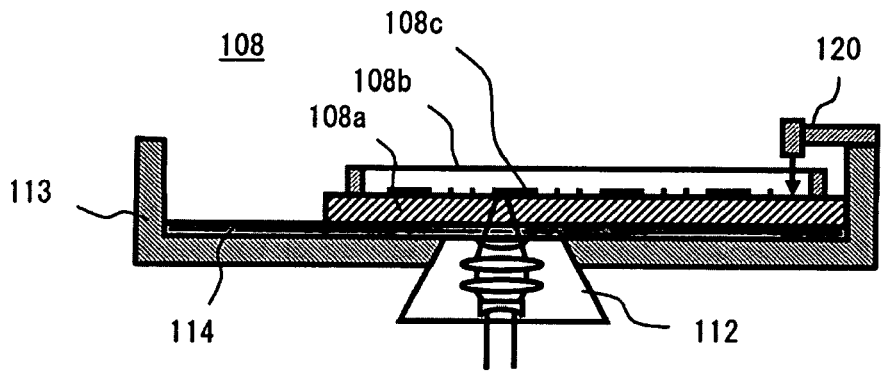
Figure 7C:
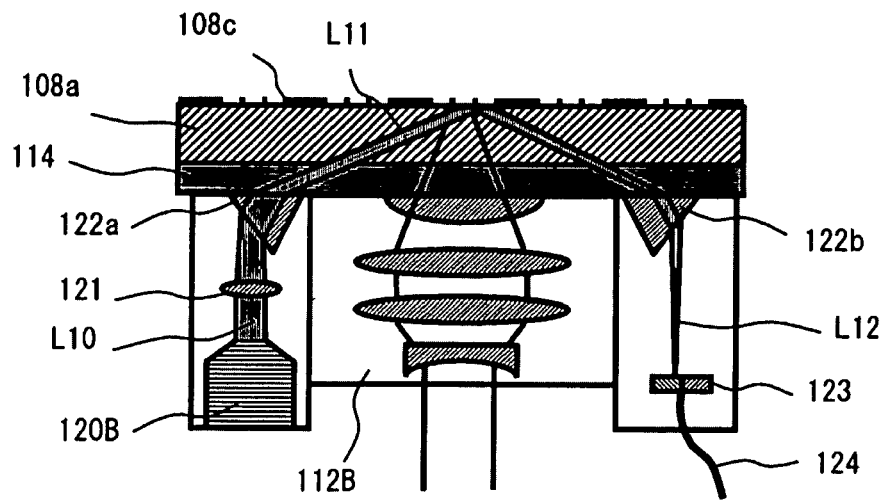

Next, the thickness of pure water in the photomask inspection apparatus of the present invention will be described using FIGS. 7A, 7B and 7C. FIGS. 7A, 7B and 7C show only the liquid immersion part and its neighborhood of the photomask inspection apparatus 100 of FIG. 1. As shown in FIG. 7A, let tmask be the thickness of the mask substrate 108a and twater be the thickness of the pure water 114. In the present invention, the distance between the mask 108 and the water bath 113 is adjusted so as to keep tmask+twater=7.00 mm not depending on the thickness of the mask substrate 108a. For example, when the thickness of the mask substrate 108a is at a standard of 6.35 mm, the thickness of the pure water 114 is at 0.65 mm. When the thickness of the mask substrate 108a is at 6.45 mm, greater than the standard, the thickness of the pure water 114 is finely adjusted to 0.55 mm.

In order to keep the sum of the thickness of the mask substrate 108a and the thickness of the pure water 114 at a constant value (here 7.00 mm) not depending on the mask, the photomask inspection apparatus of the present invention comprises an adjustment mechanism for adjusting the thickness of the pure water 114 according to the thickness of the mask substrate 108a as shown in FIG. 7B or 7C.

The adjustment mechanism shown in FIG. 7B, using a measurement semiconductor laser 120 attached to the edge of the water bath 113, finely adjusts the placement height of the mask substrate 108a such that the distance from the semiconductor laser 120 to the pattern surface 108c is constant. The arrow going down from the semiconductor laser 120 indicates laser light, and the semiconductor laser 120 (its receiving portion being omitted from the figure) receives light reflected by the upper surface of the mask substrate 108a to measure the distance thereto. Then, the height is adjusted by adjusting the amount of the pure water 114 in the water bath 113.

When designing the lens and the like in the object lens 112, also the mask substrate 108a placed in the optical path to the pattern surface 108c, an image plane, needs to be considered as a transparent plane parallel substrate. Since design is usually performed assuming that the thickness of the mask substrate 108a is constant (usually 6.35 mm), if the thickness varies, the distortion of the image increases, strictly speaking, while the focus can be readjusted. However, according to the present embodiment, the sum of the optical distance in the mask substrate 108a made of synthetic quartz and the optical distance of the pure water 114 can be kept substantially constant not depending on the thickness of the mask substrate 108a. By this means, the distortion of an enlarged image of the pattern surface 108c can be reduced to a negligible level.

An adjustment mechanism shown in FIG. 7C may be provided as another mechanism for keeping the sum of the optical distance in the mask substrate 108a and the optical distance of the pure water 114. The adjustment mechanism shown in FIG. 7C is provided on the side of a lens barrel containing the lenses and the like of an object lens 112B. As shown in FIG. 7C, a semiconductor laser 120B is attached to the object lens 112B. Laser light L10 output from the semiconductor laser 120B travels through the condenser lens 121 with converging and passes through a triangle prism 122a made of sapphire to be deflected. The triangle prism 122a is in contact with the pure water 114, and the laser light travels through the pure water 114 and the mask substrate 108a and strikes the pattern surface 108c at a large incident angle. Hence, all laser light L11 is reflected by the pattern surface 108c, travels through the pure water 114 again, and is incident on a triangle prism 122b to be deflected into laser light L12, which strikes a two-division sensor 123. Two signals from the two-division sensor 123 are led to a controller (not shown) through a signal line 124.

According to the example of FIG. 7C, when the sum of the thickness of the mask substrate 108a and the thickness of the pure water 114 varies, the position at which the laser light L12 strikes the two-division sensor 123 shifts to the right and left in FIG. 7C, which is detected in the form of variation in balance between the two signals. Therefore, the position of the mask substrate 108a may be finely adjusted vertically such that the signal balance is constant not depending on the thickness of the mask substrate 108a.

In the above example, the placement height of the mask substrate 108a is finely adjusted such that the sum of the thickness of the mask substrate 108a and the thickness of the pure water 114 is constant not depending on the mask, but in addition, the distortion can be reduced. To be specific, if the thickness of the mask substrate 108a is greater than the standard, the placement height of the mask substrate 108a is adjusted to be slightly lower. If the thickness of the mask substrate 108a is less than the standard, the placement height of the mask substrate 108a is adjusted to be slightly higher. As a result, the sum of the optical distance in the mask substrate 108a and the optical distance in the pure water 114 can be made constant not depending on the thickness of the mask substrate 108a.

For example, when the thickness of the mask substrate 108a is at 6.40 mm, greater by 0.05 mm than the standard of 6.35 mm, the placement height of the mask substrate 108a may be lowered by 0.004 mm. When the thickness of the mask substrate 108a is at 6.30 mm, less by 0.05 mm than the standard of 6.35 mm, the placement height of the mask substrate 108a may be raised by 0.004 mm.

The optical distance (distance over which light travels in vacuum to be inphase) in synthetic quartz 0.05 mm thick is 0.078 mm because the refractive index of synthetic quartz is about 1.5608 at a wavelength of 193 nm. Meanwhile, the thickness of pure water for which the optical distance is 0.078 mm is 0.054 mm because the refractive index of synthetic quartz is about 1.436 at a wavelength of 193 nm. Therefore, if pure water is simply made 0.050 mm thinner so as to keep the sum of the thicknesses of the two layers constant, the pure water is still about 0.004 mm thicker, strictly speaking.

As such, in the present invention, in order to further reduce the distortion due to variation in the thickness of the mask substrate, the placement height of the mask substrate may be finely adjusted so as to keep the optical distance of laser light passing through two layers of the mask substrate and immersion liquid constant. As described above, the pattern surface 108c is provided on the upper side, and the object lens 112 is placed below the water bath 113, and further the measurement unit for measuring the height of the pattern surface in the water bath 113 is provided. By this means, the optical path length can be adjusted to focus laser light on the pattern surface, thus further improving detection sensitivity. The measurement unit may have a configuration other than the above.

In the embodiment having been described, pure water is used as liquid for the liquid immersion, but instead of pure water, fluorine-based liquid (Fluorinert) may be used. The following table shows examples of usable fluorine-based liquid and their properties.

|  | Density | | Kinetic Viscosity | | Refractive |
| --- | --- | --- | --- | --- | --- |
|  | (@25° C.) kg/m³ | (@-54° C.) kg/m³ | (@25° C.) cSt | (@-54° C.) cSt | Index (@25° C.) |
| FC-72 | 1.680 | 1.900 | 0.4 | 1.9 | 1.251 |
| FC-84 | 1.730 | 1.930 | 0.55 | 4.0 | 1.261 |
| FC-3283 | 1.830 | — | 0.82 | — | 1.281 |
| FC-40 | 1.870 | — | 2.2 | — | 1.290 |
| FC-43 | 1.880 | — | 2.8 | — | 1.291 |
| FC-70 | 1.940 | — | 14.0 | — | 1.303 |

Figure 8A:
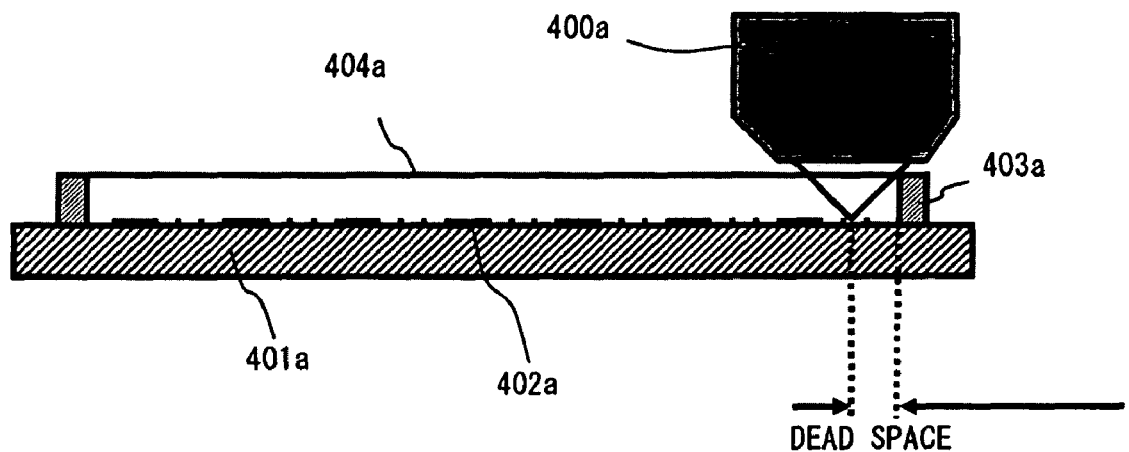
FIG. 8A illustrates dead spaces that cannot be inspected by a conventional photomask inspection apparatus.
Figure 8B:
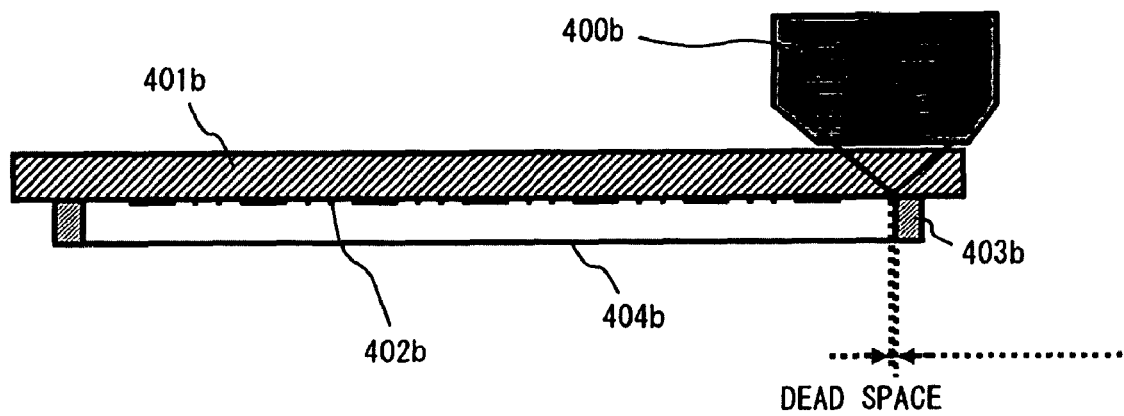
FIG. 8B illustrates dead spaces that cannot be inspected by the photomask inspection apparatus of the present invention.

Next, a dead space that cannot be inspected by the photomask inspection apparatus will be described with reference to FIGS. 8A and 8B. FIG. 8A shows the dead space for when a conventional photomask inspection apparatus is used, and FIG. 8B shows the dead space for when the photomask inspection apparatus of the present invention is used. As shown in FIG. 8A, in the conventional photomask inspection apparatus, an object lens 400a is placed on the pattern surface 402a side of a mask substrate 401a. Hence, if the numerical aperture NA of the object lens 400a is very large, illumination light will be blocked by a spacer 403a supporting a pellicle 404a.

As shown in FIG. 8B, in the present invention, an object lens 400b is placed on the back surface side of a mask substrate 401b. Hence, if the NA of the object lens 400b is very large, an inspectable area of a pattern surface 402b on the mask substrate 401b will not be reduced by the blocking of a spacer 403b supporting a pellicle 404b. That is, according to the present invention, the dead space of the pattern surface 402b will be reduced. In, e.g., the photomask inspection apparatus 200 of FIG. 2, the entire surface of a mask can be inspected with use of reflected illumination. If the numerical aperture of the condenser lenses 106, 206 is smaller than that of the object lens 112, 212, the dead space can be reduced.

Embodiment 4

Figure 9:
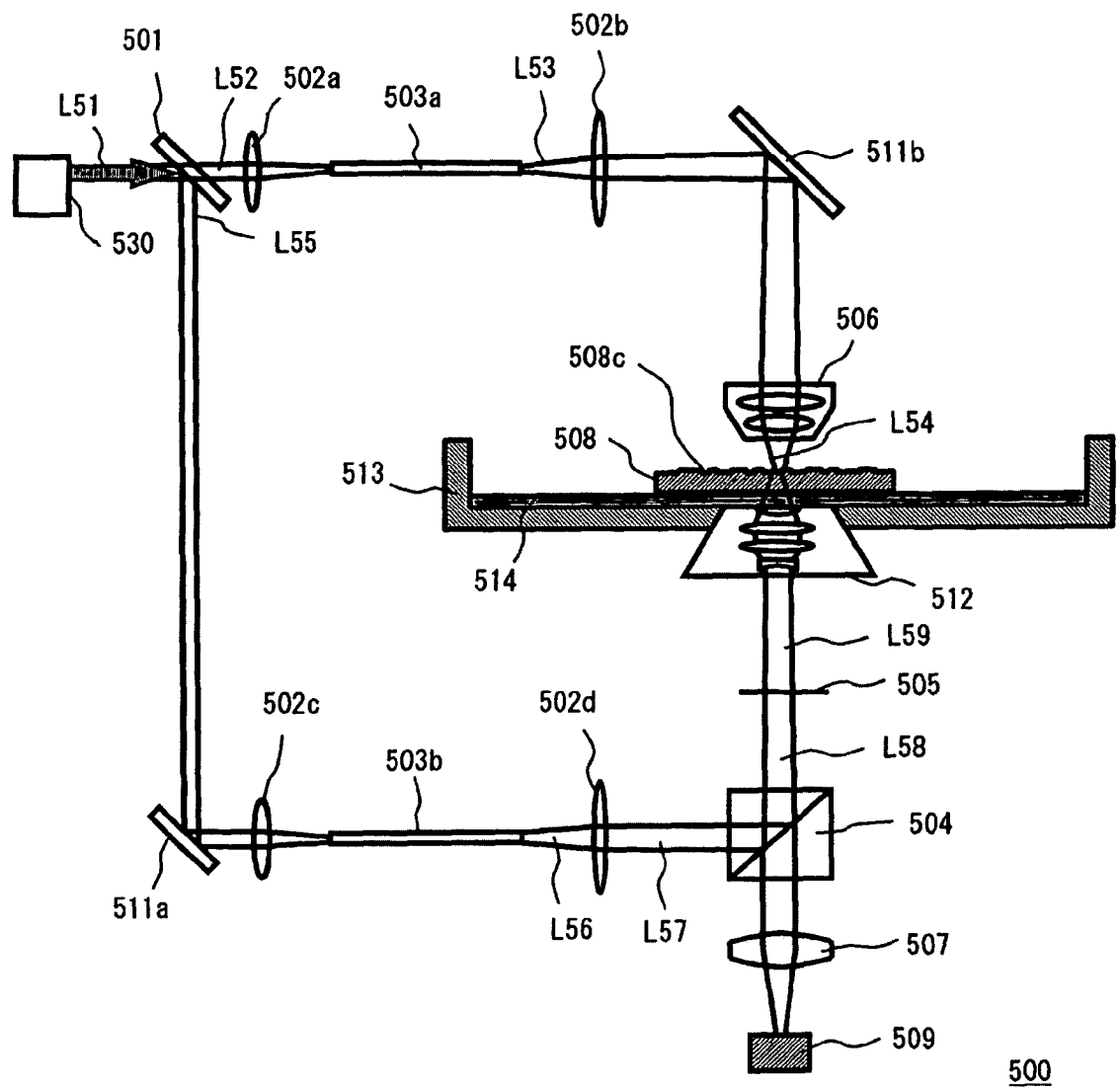
FIG. 9 shows the configuration of a photomask inspection apparatus according to embodiment 4.

A photomask inspection apparatus according to embodiment 4 of the present invention will be described with reference to FIG. 9. FIG. 9 shows the configuration of a photomask inspection apparatus 500 according to the embodiment 4. While the embodiments 1 to 3 are photomask inspection apparatuses for usual masks with a pellicle for use in ArF or krF lithography, the present embodiment is a photomask inspection apparatus for imprint masks without a pellicle. For masks made of transparent optical material such as quartz from among various imprint masks, the photomask inspection apparatus of the embodiment 1 can be used as it is. As shown in FIG. 9, the photomask inspection apparatus 500 has basically the same configuration as the photomask inspection apparatus 100 for ArF or KrF masks of FIG. 1.

In the present embodiment, laser light L51 of 193 nm in wavelength from the inspection light source 530 is used for illumination. The laser light L51 is incident on the half mirror 501 and divided into lights in two directions. Laser light L52 that has passed through the half mirror 501 travels through the lens 502a with converging and is incident on the homogenizing optical system 503a. Laser light L53 homogenized in spatial light intensity distribution is output by the homogenizing optical system 503a and passes through the lens 502b to be collimated and is deflected by the mirror 511b to be incident on the condenser lens 506, which condenses it into laser light L54. The laser light L54 illuminates an observed area in the pattern surface 508c, the upper surface, of an imprint mask 508.

Meanwhile, laser light L55 that has been reflected by the half mirror 501 is reflected by the mirror 511a and passes through the lens 502c to be incident on the homogenizing optical system 503b. Laser light L56 homogenized in spatial light intensity distribution is output by the homogenizing optical system 503b, passes through the lens 502d to be collimated, and is incident on the polarization beam splitter 504. Because it is S waves, laser light L57 is reflected by the polarization beam splitter 504 and travels upward as indicated by laser light L58. The laser light L58 passes through the quarter wavelength plate 505 to be circularly polarized into laser light L59. The laser light L59 is incident on the object lens 512 fixed in the middle of the water bath 513 and passes through the pure water 514 and an imprint mask 508 and illuminates a pattern surface 508c. Since being made of synthetic quartz, the imprint mask 508 of the present embodiment well transmits the laser light of 193 nm in wavelength.

Laser light L59 imparted with an optical image originating from an observed area in the pattern surface 508c illuminated by the transmitted illumination or the reflected illumination is output downward from the object lens 512. This laser light L59 comprises reflected light reflected by the mask 508 and transmitted light transmitted by the mask 508. The laser light L59 reflected by the mask 508 is circularly polarized in a direction opposite to that of the laser light L59 incident on the mask 508 and hence, passing through the quarter wavelength plate 505 again, becomes linearly polarized waves, here P waves. Thus, the laser light L59 reflected by the mask 508 passes through the polarization beam splitter 504. As a result, the reflected light passes through the projection lens 507 and strikes the two-dimensional photosensor 509. That is, an image of the observed area in the pattern surface 508c is enlarged by the ratio of the focal distance of the projection lens 507 to the focal distance of the object lens 512 and enlargement projected onto the two-dimensional photosensor 509. A CCD, a TDI, or the like is suitable as the two-dimensional photosensor 509. The laser light L59 that has passed through the mask 508 is also output from the object lens 512 and passes through the same optical path to be incident on the two-dimensional photosensor 509.

As such, also for an imprint mask with a fine size pattern, the photomask inspection apparatus of the present invention can be used as long as its substrate is transparent. Hence, defect inspection can be conveniently performed with high sensitivity without using a microscope that needs vacuum such as a SEM (Scanning Electron Microscope).

In the conventional photomask inspection apparatus, since observing from above the top of a pattern, measuring pattern lengths results in measuring the sizes of the top. Because the top is usually round at its edges, it is difficult to accurately measure. However, in the present invention, the pattern surface on a mask substrate is observed from the back surface side of the mask substrate. Hence, the bottom shape of the pattern can be accurately observed. As a result, the pattern lengths can be accurately measured. Therefore, the photomask inspection apparatus of the present invention can also be used in place of a length measuring SEM.

Embodiment 5

Figure 10:
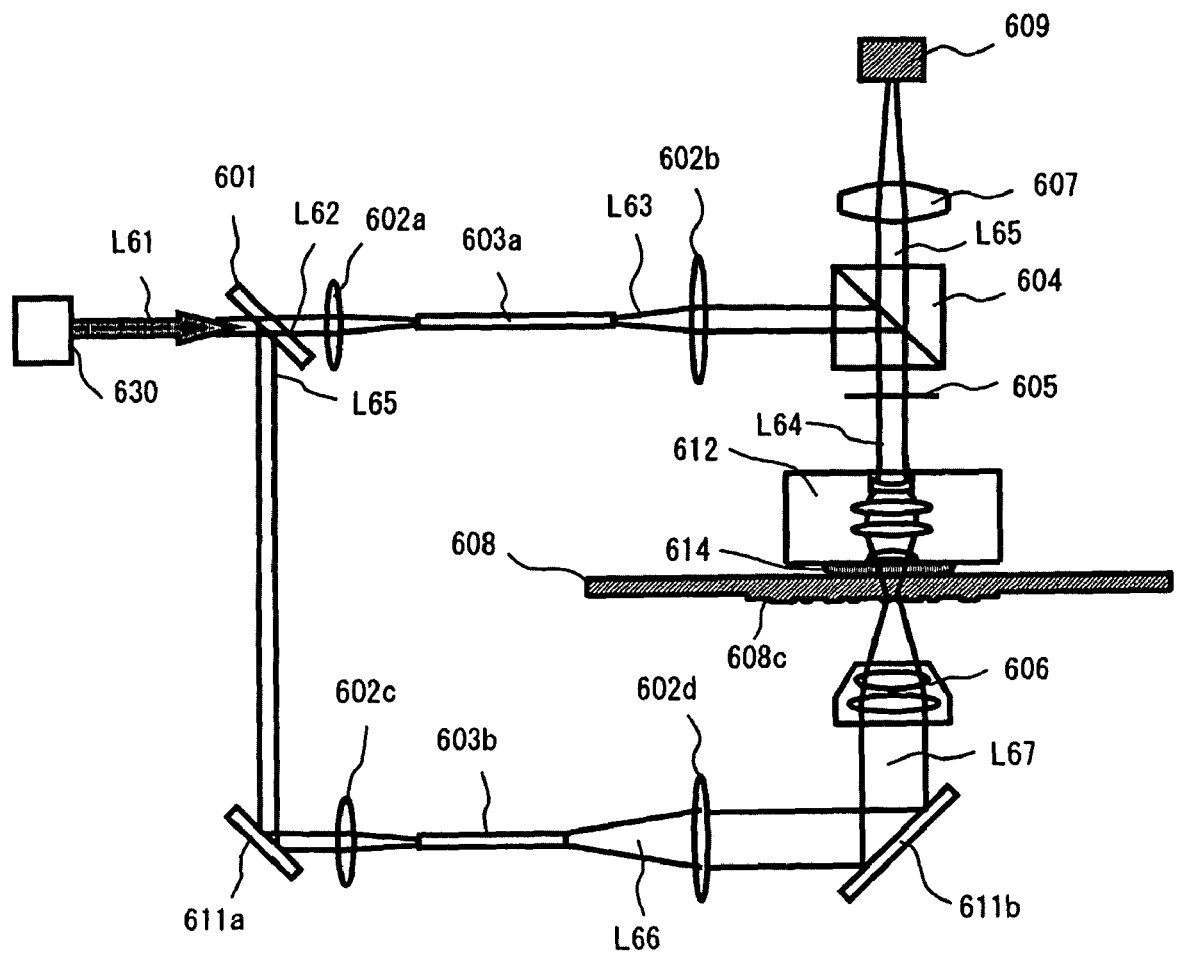
FIG. 10 shows the configuration of a photomask inspection apparatus according to embodiment 5.

A photomask inspection apparatus according to embodiment 5 of the present invention will be described with reference to FIG. 10. FIG. 10 shows the configuration of a photomask inspection apparatus 600 according to the present embodiment. The photomask inspection apparatus 600 according to the present embodiment also inspects imprint masks like the embodiment 4.

The photomask inspection apparatus 600 also uses laser light L61 of 193 nm in wavelength from the inspection light source 630 for illumination. The laser light L61 is incident on the half mirror 601 and divided into lights in two directions. Laser light L62 that has passed through the half mirror 601 travels through the lens 602a with converging and is incident on the homogenizing optical system 603a. Laser light L63 homogenized in spatial light intensity distribution is output by the homogenizing optical system 603a, passes through the lens 602b to be collimated, and is incident on the polarization beam splitter 604. Because it is S waves, laser light L63 is reflected by the polarization beam splitter 604 and travels downward and passes through the quarter wavelength plate 605 to be circularly polarized into laser light L64. The laser light L64 is incident on the object lens 612, passes through the pure water 614 and an imprint mask 608, and illuminates a pattern surface 608c formed on the opposite side.

Meanwhile, laser light L65 that has been reflected by the half mirror 601 is reflected by the mirror 611a and passes through the lens 602c to be incident on the homogenizing optical system 603b. Laser light L66 homogenized in spatial light intensity distribution is output by the homogenizing optical system 603b, passes through the lens 602d to be collimated, is deflected by the mirror 611b to be incident on the condenser lens 606, and illuminates the pattern surface 608c of the imprint mask 608.

Laser light L64 imparted with an optical image originating from an observed area in the pattern surface 608c illuminated by the transmitted illumination or the reflected illumination is output upward from the object lens 612. The laser light L64 comprises reflected light reflected by the mask 608 and transmitted light transmitted by the mask 608. The laser light L64 reflected by the mask 608 is circularly polarized in a direction opposite to that of the laser light L64 and hence, passing through the quarter wavelength plate 605 again, becomes linearly polarized waves, here P waves. Thus, the laser light L64 reflected by the mask 608 passes through the polarization beam splitter 604 and passes through the projection lens 607 and strikes the two-dimensional photosensor 609. Thereby, an image of the observed area in the pattern surface 608c is enlarged and projected onto the two-dimensional photosensor 609. A CCD, a TDI, or the like is suitable as the two-dimensional photosensor 609 like in the above embodiments. The laser light L64 that has passed through the mask 608 is also output from the object lens 612 and passes through the same optical path to be incident on the two-dimensional photosensor 609.

The feature of the present embodiment is that the pure water 614 filling the space between the object lens 612 and the imprint mask 608 is supplied from the pure water supply unit (not shown) and sucked into the pure water sucking unit (not shown), which are attached to the object lens 612, like with the object lens 330 of FIG. 5A or the object lens 340 of FIG. 6A. The photomask inspection apparatus 600 of the present embodiment features the use of the local-fill scheme. Consequently, the pure water 614 does not fall off the imprint mask 608, and hence the object lens 612 can be placed above the imprint mask 608. That is, the pattern surface 608c of the imprint mask 608 faces downward. This direction is the same as the direction in which to imprint a wafer in an imprint exposure apparatus. Thus, when the photomask inspection apparatus 600 of the present embodiment is used to regularly inspect imprint masks used in an imprint exposure apparatus, the imprint masks need not be inverted. Therefore, with the photomask inspection apparatus 600 incorporated in an imprint exposure apparatus, quick mask inspection can be performed.

Figure 11:
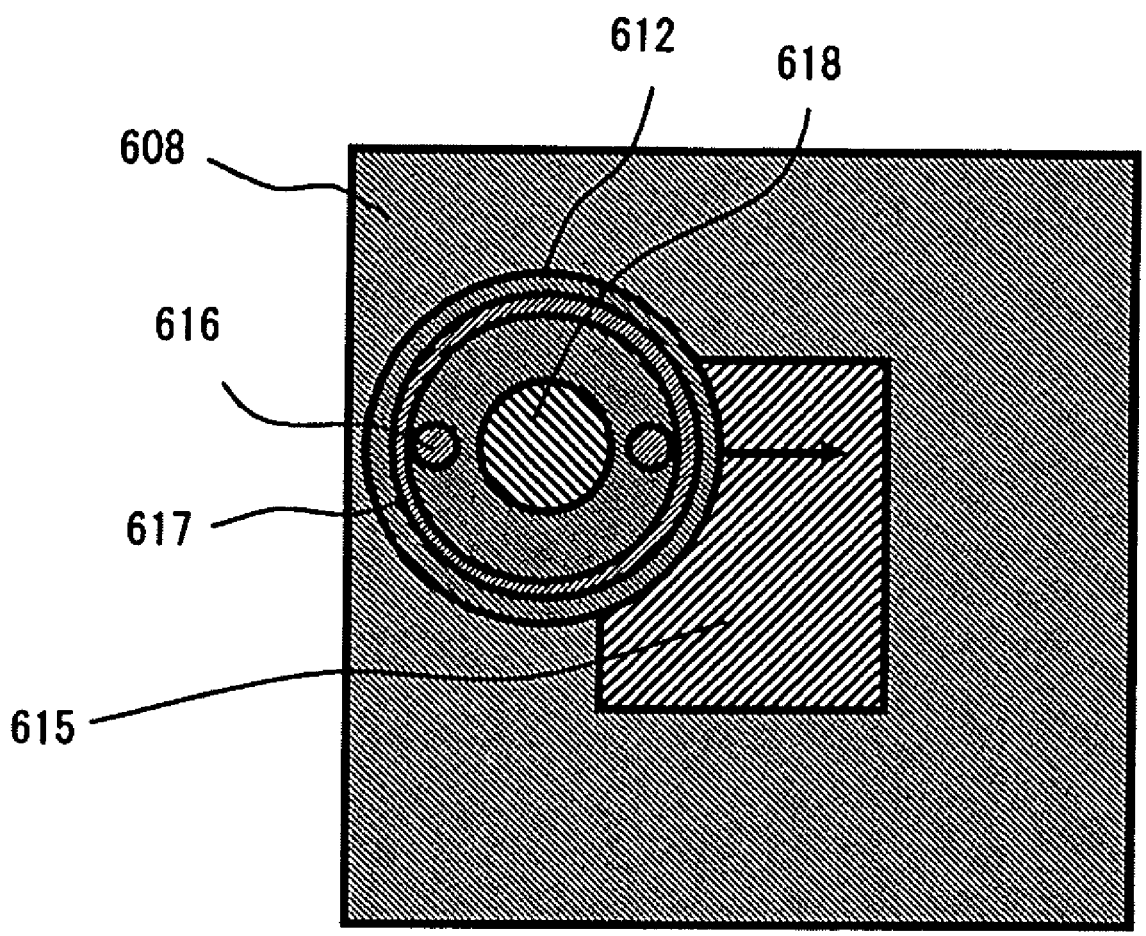
FIG. 11 illustrates the case where an imprint mask is inspected.

The imprint mask 608 in the present embodiment is four times the size of the usual imprint mask 508 of FIG. 9 and is of the same size as a usual KrF mask or ArF mask, called a 6-inch mask. The inspection of this imprint mask will be described with reference to FIG. 11. As shown in FIG. 11, a pattern area 615 covers only the middle of the imprint mask 608. Hence, when observing the edge of the pattern area 615 with the object lens 612 having an outlet 616 for the pure water 614, that is, when the last lens 618 of the object lens 612 is located over an edge of the pattern area 615, the outlet 616 and the inlet 617 is not outside the imprint mask 608. Therefore, in the present embodiment, the object lens 612 is placed above the imprint mask 608, and the local-fill scheme can be used.

Embodiment 6

Figure 12:
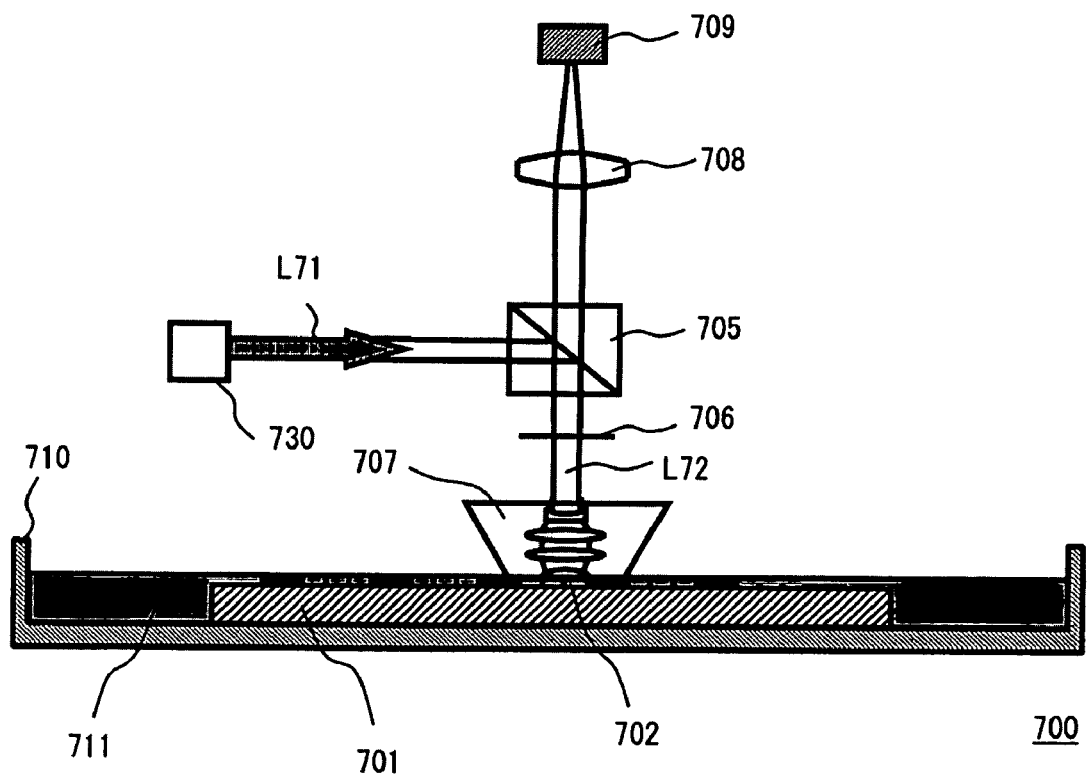
FIG. 12 shows the configuration of a photomask inspection apparatus according to embodiment 6.
Figure 13:
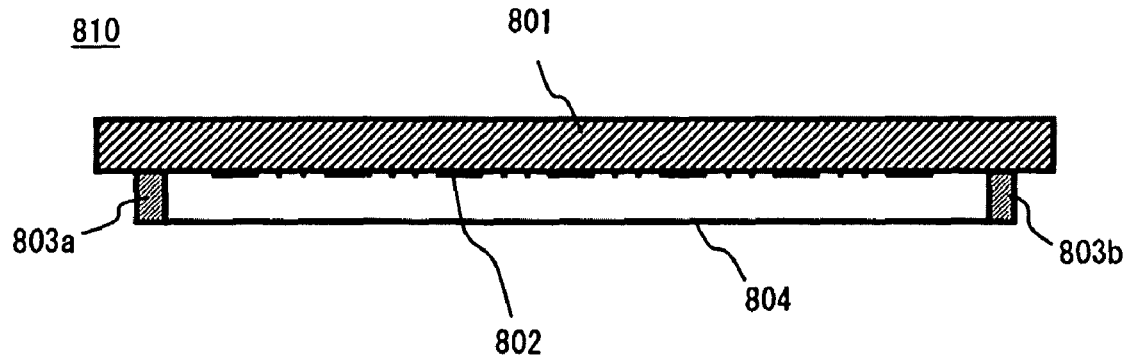
FIG. 13 is a sectional view showing the configuration of a conventional mask.
Figure 14:
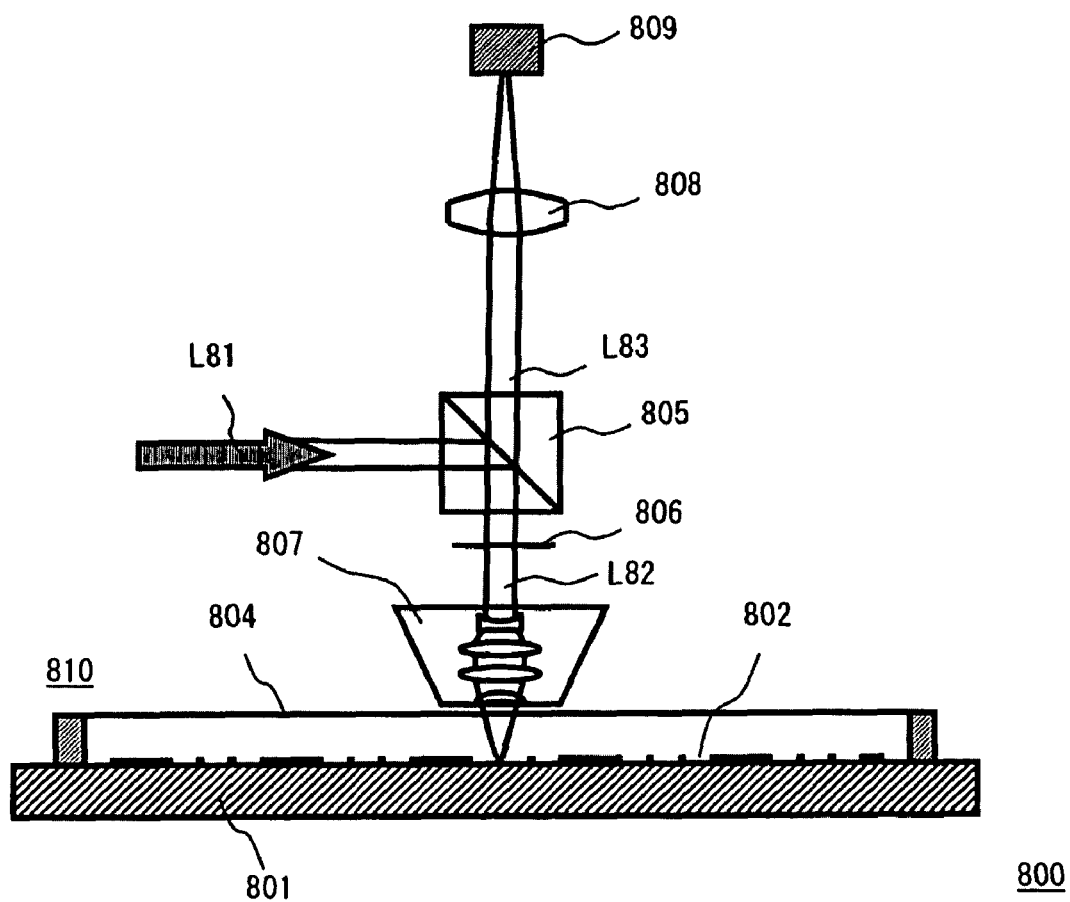
FIG. 14 shows the configuration of a conventional photomask inspection apparatus.
Figure 15:
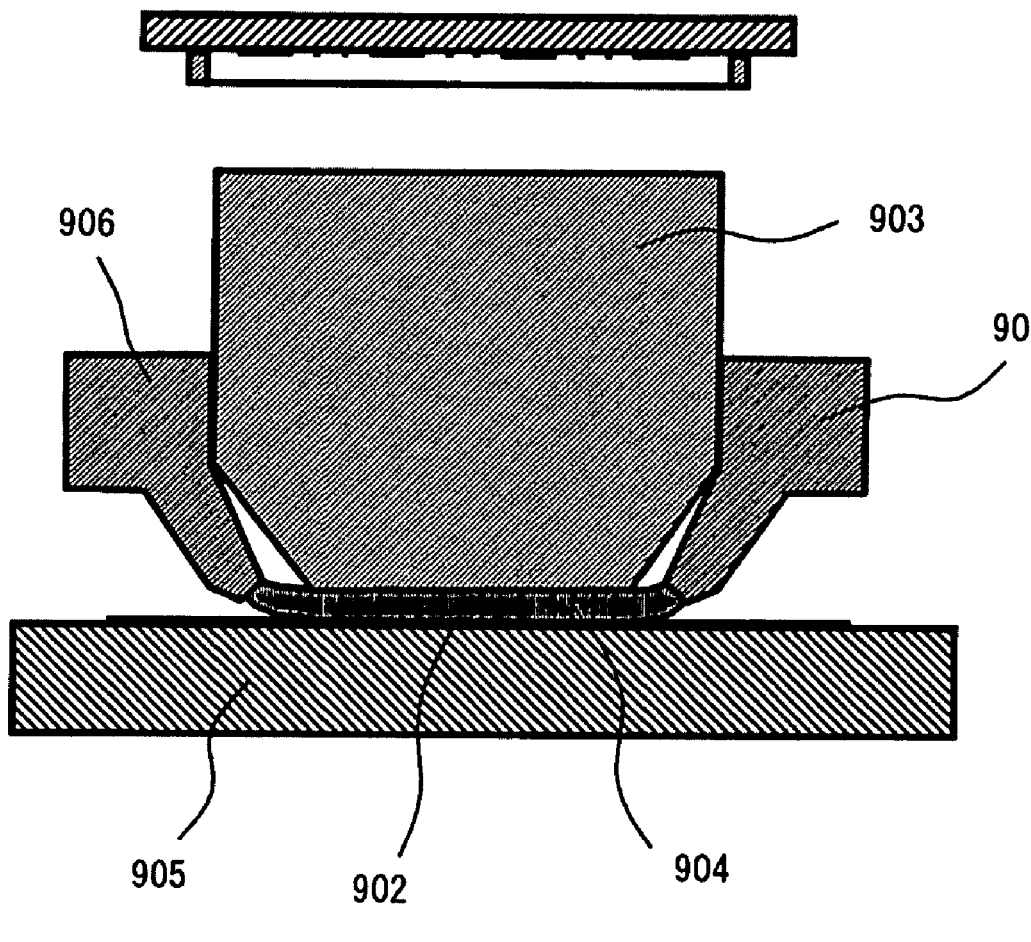
FIG. 15 shows the configuration of a conventional liquid immersion exposure apparatus.

A photomask inspection apparatus according to embodiment 6 of the present invention will be described with reference to FIG. 12. FIG. 12 shows the configuration of a photomask inspection apparatus 700 according to the present embodiment. The photomask inspection apparatus 700 inspects EUV masks. In the photomask inspection apparatus 700, laser light L71 of 193 nm in wavelength for illumination is S waves. Hence, the laser light L71 from the inspection light source 730 is reflected by the polarization beam splitter 705, travels downward, passes through the quarter wavelength plate 706 to be circularly polarized, then passes through the object lens 707, and illuminates a pattern surface 702 of an EUV mask 701. Laser light L72 imparted with an optical image originating from the illuminated pattern surface 702 travels upward through the object lens 707 and passes through the quarter wavelength plate 706 again to become here P waves. Thus, the laser light L72 is transmitted by the polarization beam splitter 705 and enlargement projected by the projection lens 708 onto the two-dimensional photosensor 709. The laser light reflected by the mask 701 passes through the quarter wavelength plate 706 to become P polarized like the above embodiments. Thus, light use efficiency can be improved.

In the present embodiment, the EUV mask 701 is placed in a water bath 710 containing high-refractive-index liquid 711. Thus, the space between the pattern surface 702 of the EUV mask 701 and the object lens 707 is filled with the high-refractive-index liquid 711. In the present embodiment, the pattern surface 702 having recesses and raised portions is in contact with the high-refractive-index liquid 711. In order to allow the high-refractive-index liquid 711 to permeate into the recesses, the liquid immersion optical system with the water bath 710 is used, and the EUV mask 701 is immersed in the high-refractive-index liquid 711 in the water bath 710.

A liquid of about 1.64 in refractive index is used as the high-refractive-index liquid 711. As a result, substantially the same level of resolution is obtained as in the case of inspection with an inspection light source of 118 nm in wavelength. For example, high-purity carbon-hydrogen-based liquid developed by JSR Corp. is suitable as the high-refractive-index liquid 711, but instead of the high-refractive-index liquid 711, pure water may be used in this embodiment as well.

As described above, with the photomask inspection apparatus according to the present invention, the actual wavelength of the inspection light source is about 124 nm when laser light of 193 nm in wavelength is used as the light source. Hence, defects and the like can be detected with sensitivity about 1.56 times as high as with a conventional apparatus. Since the limit size of detectable defects is said to be about one fourth of the inspection light wavelength, the limit size becomes about 31 nm. That is, for quadruple-size masks, transferred defects on wafers of sizes down to about 8 nm can be covered. Thus, not only a 22 nm generation of lithography but also 16 nm and 11 nm generations can be covered. For imprint masks, i.e., equal-size masks, a 32 nm generation can be covered.

In the present invention, when retrieving an inspected mask, pure water sticking to the mask substrate needs to be removed. Blowing off by dry air or sucking with a vacuum sucking device can be used, or the back surface of the mask substrate may be wiped with cylindrical sponge made of non-dusting material, and thereby pure water can be easily removed from the mask.

In order to enable highly accurate inspection with the photomask inspection apparatus of the present invention, synthetic quartz for the mask substrate is preferably material of high quality used for lenses of exposure apparatuses, that is, quartz with as small variation in refractive index as possible.

Moreover, the following modification may be made to the mask. Where pure water is used as liquid for liquid immersion, because there is a slight difference in refractive index between the pure water and quartz of the mask substrate, antireflection coating may be coated on the back surface of the mask substrate. Further, where the mask 108 is moved in the water bath 113 as shown in FIG. 1, hydrophobic coating may be coated around the mask substrate 108a so that water hardly sticks thereto.

Although description has been made taking a UV exposure mask or an imprint mask as an example, the present invention is not limited to this. That is, the photomask inspection apparatus can inspect masks for use in exposure for forming patterns. Thus, the masks in the present invention include reticles as well. Although in the above description light from the inspection light source is divided into two lights for transmitted illumination light and reflected illumination light, the present invention is not limited to this. For example, the photomask inspection apparatus may have a transmitted illumination light source and a reflected illumination light source. Further, the embodiments may be combined as needed. Yet further, in order to pick up transmitted images or reflected images, a shutter may be inserted in each optical path. When transmitted images are picked up, a shutter is inserted in the optical path for the reflected illumination light, and when reflected images are picked up, a shutter is inserted in the optical path for the transmitted illumination light.

The main effects of the present invention will be described below. In the photomask inspection apparatus of the present invention, applying the liquid immersion technique, the space between the pattern surface of the mask and the last lens of the object lens closest to the mask substrate is filled with liquid, expelling an air layer. By this means, with the simple configuration, resolution and thus defect detection sensitivity can be improved. Further, the transmitted illumination from the pattern surface side enables the inspection of masks with a pellicle. As shown in the embodiments 1 to 5, the object lens is preferably placed on the back surface (non-pattern surface) side of the mask substrate, the opposite side thereof from the pattern surface. By this means, the liquid can be prevented from sticking to the pattern surface.

An image from the observed area of the pattern surface does not pass through the object lens without passing through the mask substrate. Because the mask substrate of ArF masks or KrF masks is made of transparent synthetic quartz, the pattern surface can be observed from the back surface side. Thus, the liquid immersion optical system where the space between the back surface and the last lens of the object lens is filled with liquid can be used. Further, since the back surface to contact the liquid is extremely flat, sticking liquid is extremely easy to remove, and it does not occur that the liquid is difficult to remove from the mask substrate after inspection.

As such, it is a feature of the present invention that the liquid immersion part is the flat back surface. The reason is as follows. If the pattern surface is immersed in liquid, the liquid will flow along the pattern surface having recesses and raised portions, and particularly at high pattern-density part, it is difficult for the liquid to go into between the raised portions, and thus it is difficult to achieve complete liquid immersion.

In the present invention, the term object lens refers to a group of lenses arranged on the mask pattern side in an optical system which enlargement projects an image of a to-be-inspected area in a mask pattern onto a two-dimensional photosensor or the like for detecting an image. The enlargement projecting optical system comprises an object lens and at least one more group of lenses or lens (herein called a projection lens). The focal distance of the projection lens is longer than that of the object lens, and thus the image is enlargement projected.

Usually, the thickness of the mask substrate is specified as 6.35 mm, but in reality, there is a variation of about ±0.1 mm. Hence, an image of the observed area in the pattern surface may be distorted. The reason is as follows. Each lens in the object lens used in the present invention is designed assuming that a 6.35 mm thick quartz-made parallel plate is included in the projection optical system. Hence, when the thickness of the mask substrate varies, focusing can be achieved by adjusting the distance between the object lens and the observed area, but it is difficult to design each lens so as to control distortion to a negligible level, about several nm or less, over the entire range of variations in thickness.

Accordingly, as described above, the adjustment mechanism is provided to adjust the thickness of water filling the space between the mask substrate and the last lens of the object lens at least for each mask to be inspected. By this means, even if there is variation in the thickness of the mask substrate, the sum of the thickness of the mask substrate and the thickness of water can be kept substantially constant.

The refractive index of quartz of the mask substrate is about 1.56 at a wavelength of 193 nm, and the refractive index of water is about 1.44. These are much greater than the 1.0 of air. Thus, the total optical distance of the two layers can be kept substantially the same with variation in the thickness of the mask substrate cancelled out by the other. Therefore, observation at the focal position can be performed, thus improving detection sensitivity.

Embodiment 7

Figure 16:
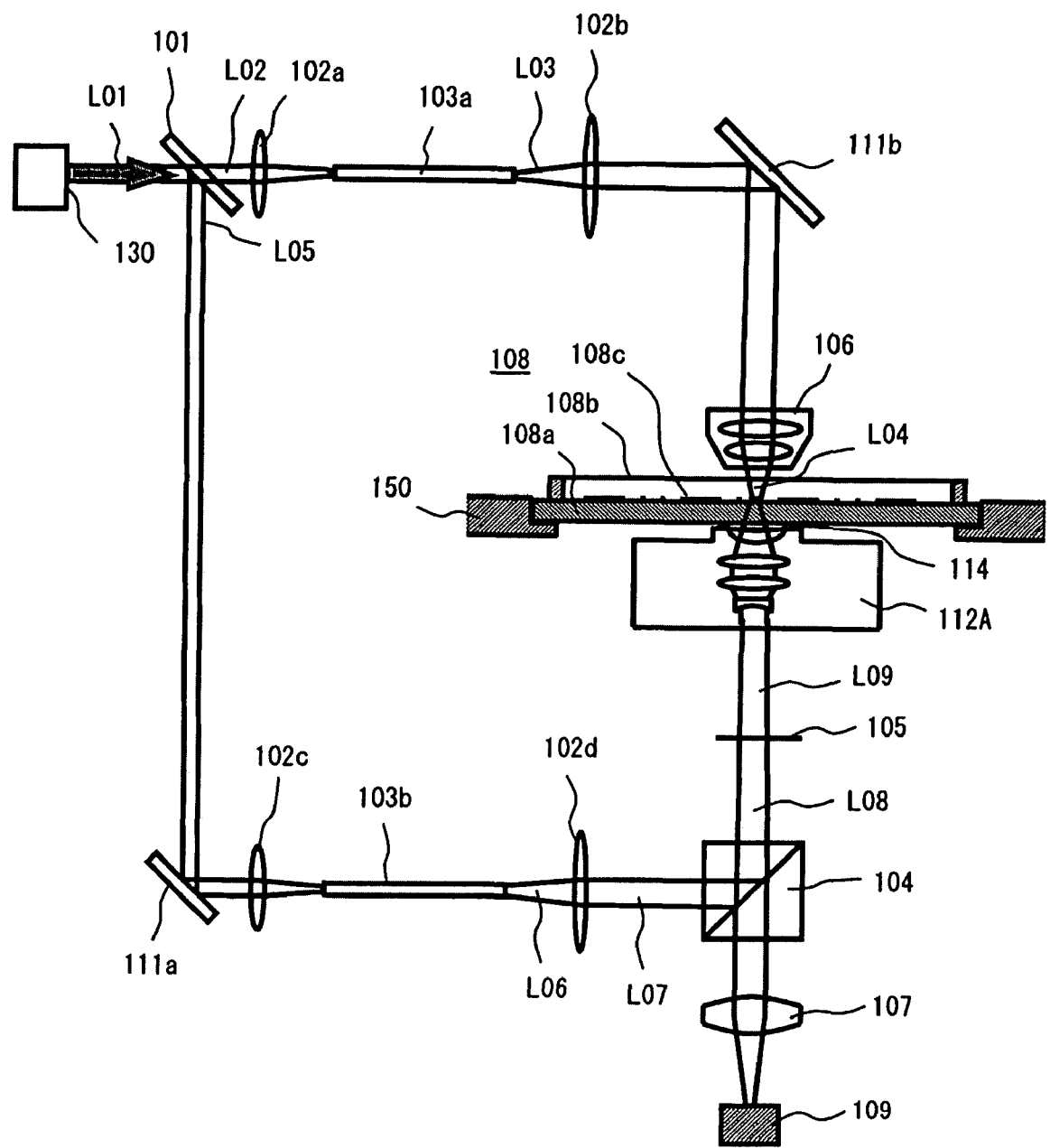
FIG. 16 shows the configuration of a photomask inspection apparatus according to embodiment 7.
Figure 17A:
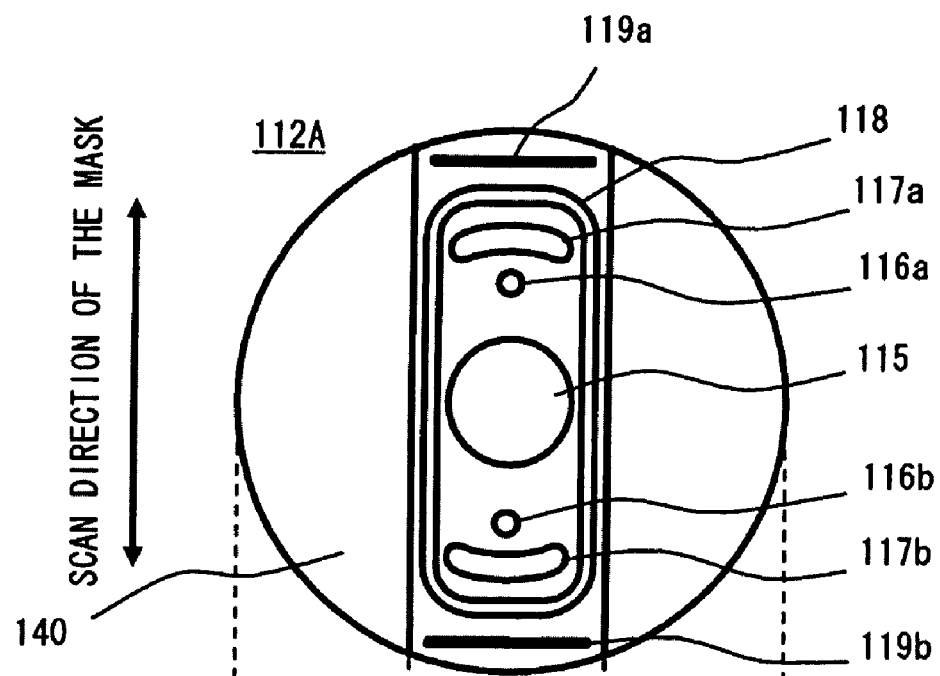
FIGS. 17A and 17B show the configuration of an object lens used in the embodiment 7.
Figure 17B:
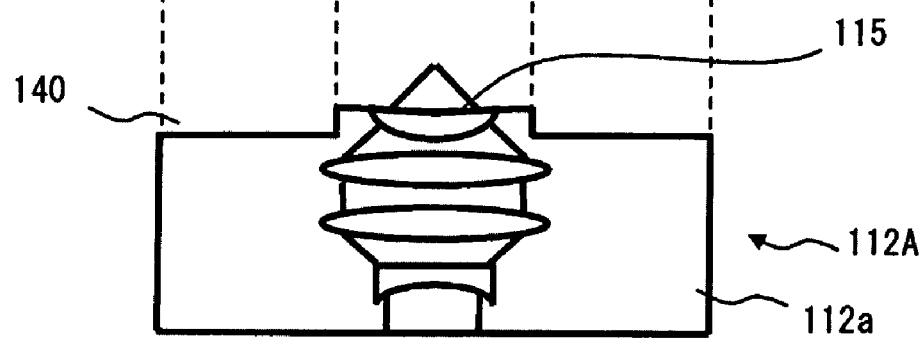
Figure 18A:
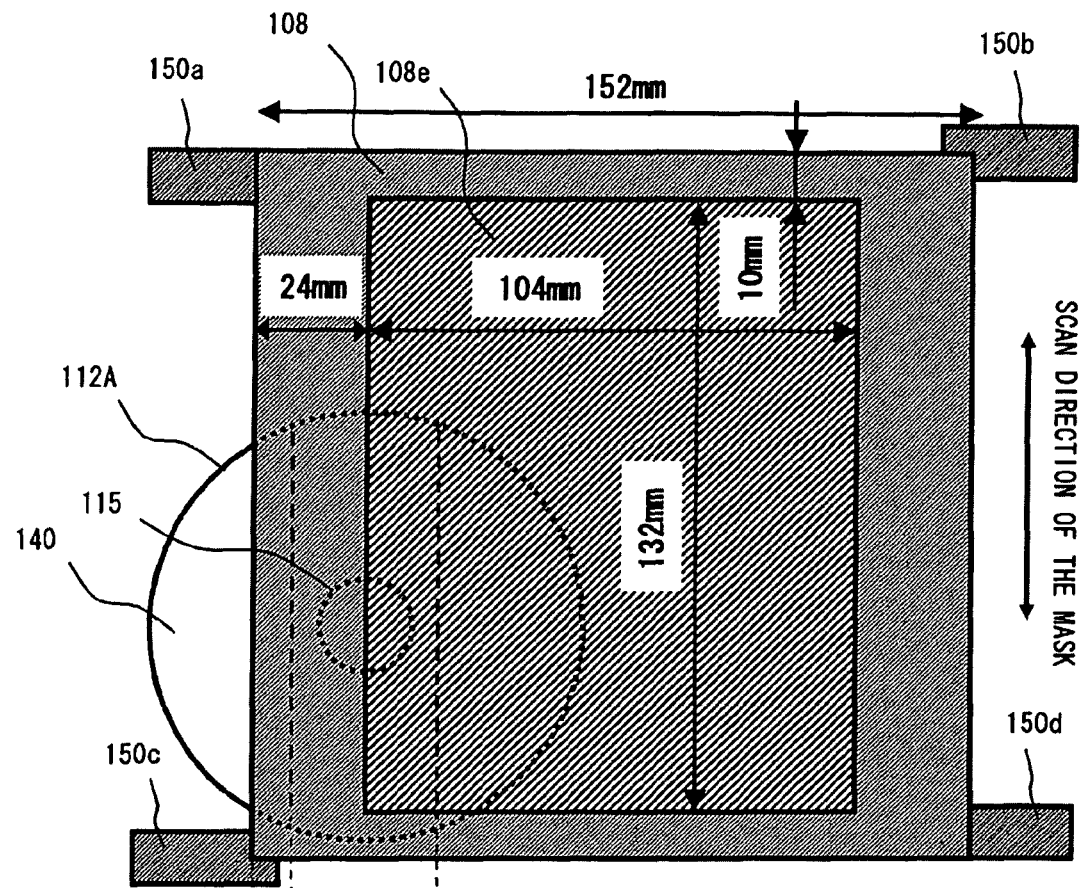
FIGS. 18A and 18B illustrate the relative position of the object lens to a pattern area of a mask.
Figure 18B:
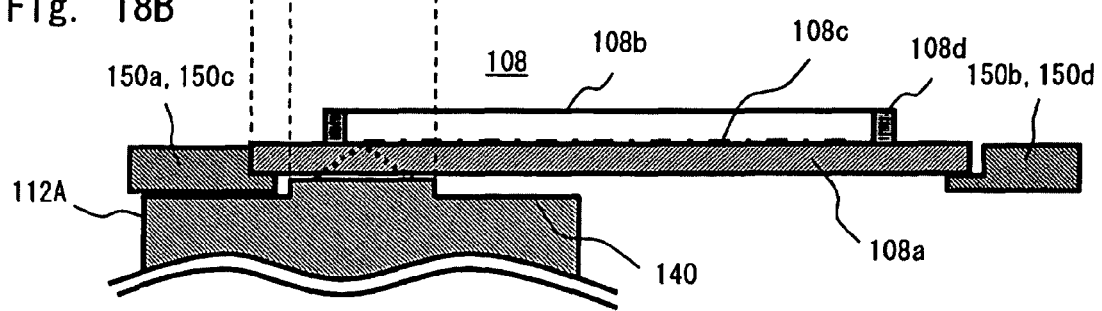

A photomask inspection apparatus according to embodiment 7 of the present invention will be described with reference to FIGS. 16 to 18. FIG. 16 shows the configuration of a photomask inspection apparatus 100 according to the present embodiment. FIGS. 17A and 17B show the configuration of a liquid immersion object lens 112A of the present embodiment. FIG. 17A is a view of the object lens 112A as seen from above (from the last lens 115 side), and FIG. 17B is a sectional view thereof. FIGS. 18A and 18B illustrate the relative position of the object lens 112A to a pattern area 108e of a mask. FIG. 18A is a view of the mask 108 as seen from above, and FIG. 18B is a side view thereof. The photomask inspection apparatus of the present embodiment differs from the photomask inspection apparatus 100 shown in FIG. 1 of the embodiment 1 in the structure of the object lens 112A. In FIG. 16, the same reference numerals indicate the same components as in the photomask inspection apparatus of FIG. 1 with description thereof being omitted.

As described above, the inventors applied the liquid immersion technique to photomask inspection apparatuses and invented a liquid immersion photomask inspection apparatus whose sensitivity can be improved by a factor of about 1.5. As opposed to an exposure apparatus to which the liquid immersion technique has been applied, the pattern surface of a mask is covered by a transparent thin film called a pellicle, and hence the pattern surface cannot be directly in contact with liquid immersion water such as pure water. Accordingly, the inventors invented a liquid immersion photomask inspection apparatus configured to observe the pattern surface from the back surface side of the mask substrate so that the liquid immersion technique can be applied.

However, there is the following task with the liquid immersion photomask inspection apparatus. Where as shown in FIGS. 20A and 20B the object lens 112 is placed under the mask 108, in order to prevent claws of an arm supporting the mask 108 from interfering with the object lens 112, the maximum allowable pattern surface 108c cannot entirely be inspected.

Figure 20A:
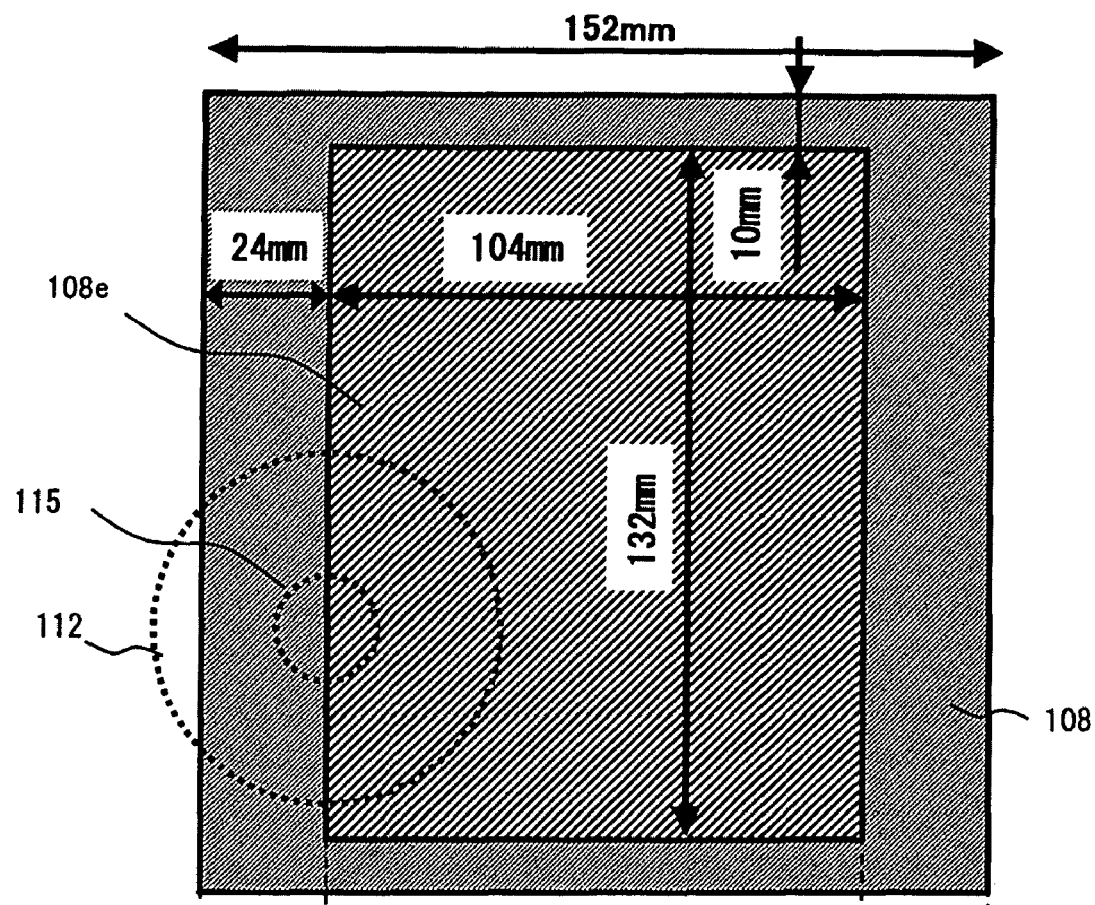
FIGS. 20A and 20B illustrate the relative position of the object lens to a pattern area of a mask.
Figure 20B:
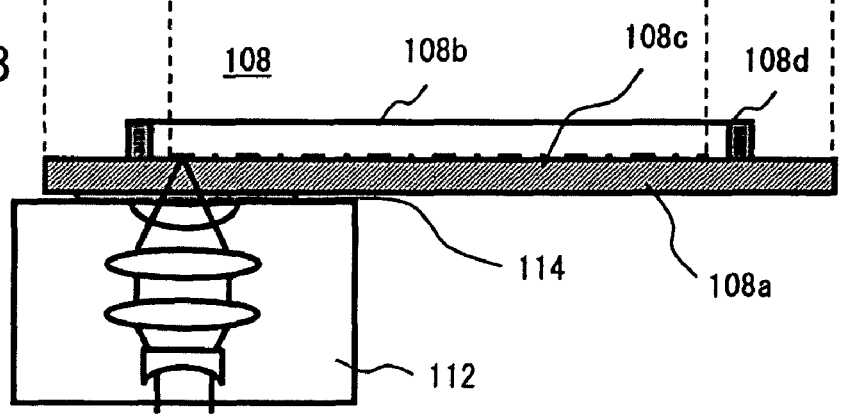

As shown in FIGS. 20A and 20B, the maximum size of the pattern area 108e of a 6-inch mask of 152 mm square is 132 mm×104 mm. Hence, when inspecting an edge of the pattern area 108e, the body (if cylindrical, its outer diameter) of the liquid immersion object lens 112 is partly outside the 152-mm-square mask 108. Meanwhile, the liquid immersion water fills the space between the mask substrate 108a and the liquid immersion object lens 112, but since the space is usually as thin as about 1 mm, the claws of the arm cannot be inserted into the space. Thus, there was the problem that in the type of liquid immersion photomask inspection apparatus that the object lens 112 is placed under the mask 108, the inspectable area of the pattern area 108e is about several tens mm narrower than the maximum allowable size.

One reason why when the object lens 112 is located near an edge of the pattern area 108e for observation, its body is partly outside the mask 108 is that usually the outer diameters of a plurality of lenses forming the object lens 112 used in the photomask inspection apparatus are larger than that of the last lens. For example, when the outer diameter of the last lens is about 20 mm, lenses of about 50 mm in outer diameter are used inside. Another reason is that while in order to observe at a high magnification of 100 or greater, the focal distance of the object lens 112 used in the photomask inspection apparatus needs to be as very short as 2 to 3 mm, work distance needs to be about 7 to 8 mm, greater than the focal distance. As a result, the object lens as shown in FIGS. 20A and 20B, of about 50 to 60 mm in outer diameter are used inside.

In order to solve the problem, the inventors invented the object lens 112A as shown in FIG. 16. As shown in FIG. 16, a photomask inspection apparatus 100, as in the embodiment 1, comprises an inspection light source 130, a half mirror 101, lenses 102a to 102d, homogenizing optical systems 103a, 103b, a polarization beam splitter 104, a quarter wavelength plate 105, a condenser lens 106, a projection lens 107, a two-dimensional photosensor 109, mirrors 111a, 111b, the object lens 112A, a water bath 113, and pure water 114. The photomask inspection apparatus 100 uses laser light L01 of 193 nm in wavelength from the inspection light source 130 for illumination. The laser light L01 is incident on the half mirror 101 and divided into lights in two directions.

First, the transmitted illumination will be described. Laser light L02 that has passed through the half mirror 101 travels through the lens 102a with converging and is incident on the homogenizing optical system 103a. Laser light L03 homogenized in spatial light intensity distribution is output by the homogenizing optical system 103a and passes through the lens 102b to be collimated and is deflected by the mirror 111b to be incident on the condenser lens 106, which condenses it into laser light L04. The laser light L04 illuminates an observed area in the pattern surface 108c of the mask 108. The condenser lens 106 is placed directly above the pellicle 108b of the mask 108.

Next, the reflected illumination will be described. Laser light L05 that has been reflected by the half mirror 101 is reflected by the mirror 111a and passes through the lens 102c to be incident on the homogenizing optical system 103b. Laser light L06 homogenized in spatial light intensity distribution is output by the homogenizing optical system 103b, passes through the lens 102d to be collimated, and is incident on the polarization beam splitter 104. Because it is S waves, laser light L07 is reflected by the polarization beam splitter 104 and travels upward as indicated by laser light L08. The laser light L08 passes through the quarter wavelength plate 105 to be circularly polarized into laser light L09. The laser light L09 is incident on the liquid immersion object lens 112A fixed in the middle of the water bath 113 and passes through the pure water 114 and the mask substrate 108a of the mask 108 and illuminates the pattern surface 108c from below.

An optical system for observing an observed area in the pattern surface 108c of the mask 108 will be described below. Laser light L09 imparted with an optical image originating from an observed area in the pattern surface 108c illuminated by the transmitted illumination or the reflected illumination is output downward from the object lens 112A, which laser light contains optical information in the form of a spatial light intensity distribution. The laser light L09 is circularly polarized in an opposite direction and hence, passing through the quarter wavelength plate 105 again, becomes here P waves and passes through the polarization beam splitter 104. As a result, the light passes through the projection lens 107 and strikes the two-dimensional photosensor 109. That is, an image of the observed area in the pattern surface 108c is enlarged by the ratio of the focal distance of the projection lens 107 to the focal distance of the liquid immersion object lens 112A and enlargement projected onto the two-dimensional photosensor 109.

The focal distance of the liquid immersion object lens 112A is about 3 mm. Meanwhile, the focal distance of the projection lens 107 is about 300 mm. As a result, an image of the observed area of the pattern surface 108c is enlarged by a factor of about 100 and projected onto the two-dimensional photosensor 109. A CCD, a TDI, or the like is suitable as the two-dimensional photosensor 109.

In the photomask inspection apparatus 100, because the liquid immersion object lens 112A is placed under the mask 108, and the pure water 114 as liquid immersion water fills the space between the mask substrate 108a and the liquid immersion object lens 112A during inspection. By this means, the NA of the liquid immersion object lens 112A is as high as 1 and sensitivity is improved by a factor of about 1.5 over a conventional photomask inspection apparatus with light of the same wavelength.

The structure of the liquid immersion object lens 112A will be described in detail with reference to FIG. 17A. The object lens 112A comprises a body 112a, an last lens 115, pure water supply ports 116a, 116b, first pure water sucking ports 117a, 117b, a second pure water sucking port 118, dry air outlets 119a, 119b, and steps 140.

The body 112a of the liquid immersion object lens 112A is substantially cylindrical. The last lens 115 is provided in the center of the top of the body 112a. The pure water supply ports 116a, 116b are formed respectively upstream and downstream in the mask scan direction of the last lens 115. The pure water 114 is supplied from the pure water supply port 116a or 116b. Which of the pure water supply ports 116a, 116b supplies the pure water is determined by the scan direction of the mask 108 during inspection. That is, the pure water 114 is supplied from the pure water supply port 116a or 116b upstream in the scan direction of the mask 108 such that supplied pure water covers the entire face of the last lens 115 during the scan of the mask 108.

The first pure water sucking ports 117a, 117b are provided respectively upstream and downstream in the scan direction of the pure water supply ports 116a, 116b. The pure water 114 supplied from the pure water supply port 116a or 116b is sucked into either the first pure water sucking port 117a or 117b. The first pure water sucking ports 117a, 117b are connected to a vacuum sucking device (not shown), which operates all the time during inspection.

The second pure water sucking port 118 is formed outward of the first pure water sucking ports 117a, 117b so as to surround them. If the pure water 114 supplied could not be completely retrieved by the first pure water sucking port 117a or 117b, pure water that could not be sucked is sucked into the second pure water sucking port 118, which has a large opening surrounding them.

The dry air outlets 119a, 119b are formed outward of the second pure water sucking port 118 upstream and downstream in the scan direction. If pure water sticks to the mask substrate 108a and is hard for even the second pure water sucking port 118 to suck in, by the dry air outlets 119a, 119b ejecting dry air, pure water sticking to the mask substrate 108a is blown off. The blown-off pure water is sucked into the second pure water sucking port 118.

As shown in FIG. 17B, the steps 140 are formed in the top (the last lens 115 side) of the body 112a on opposite sides in a direction orthogonal to the scan direction. The body 112a of the object lens 112A has a shape where the steps are made by cut in the area of the top excluding the second pure water sucking port 118 and the dry air outlets 119a, 119b as well as the last lens 115. The steps are a main feature of the present embodiment, and with the steps 140, the entire pattern area 108e of the mask can be thoroughly inspected as described below.

The height of the steps 140 corresponds to the thickness of claws 150a, 150b, 150c, and 150d of the arm described later. The height of the step 140 can be, e.g., about 4 to 5 mm. The relative relationship between the mask substrate 108a of the mask 108 and the object lens 112A will be described with reference to FIGS. 18A and 18B. FIGS. 18A and 18B show the case where the lower left edge of the pattern area 108e is observed with the liquid immersion object lens 112A.

As shown in FIGS. 18A and 18B, the mask 108 is supported at four corners of the mask substrate 108a by the claws 150a, 150b, 150c, and 150d of the arm from below. As shown in FIG. 18A, when the lower left edge of the pattern area 108e is observed, the body 112a of the liquid immersion object lens 112A is partly outside the mask 108 as seen from above. However, as seen from side, the claw 150c of the arm is received in the step 140 made in the top of the liquid immersion object lens 112A. Likewise, when the upper left edge, upper right edge, and lower right edge of the pattern area 108e are observed, the claws 150a, 150b, and 150d of the arm are received in the steps 140 of the liquid immersion object lens 112A. Hence, the object lens 112A does not interfere with the claws 150 of the arm, and thus the edges of the pattern area 108e can also be observed.

Figure 19:
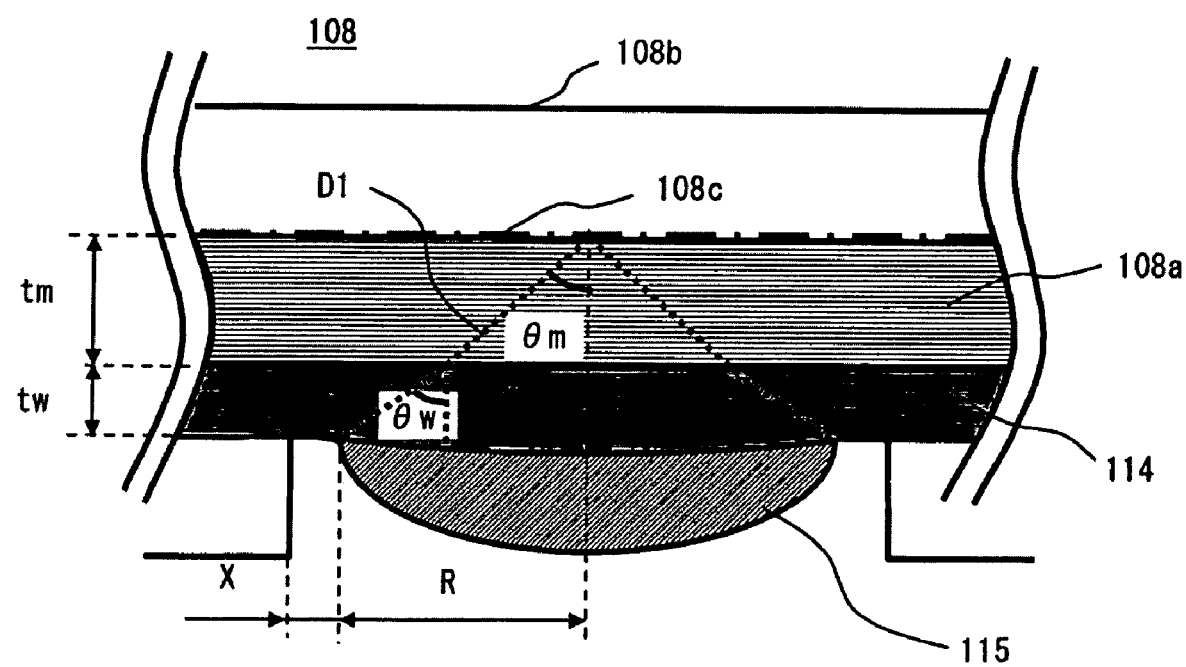
FIG. 19 illustrates the outer diameter of the object lens.

The outer diameter of the liquid immersion object lens 112A of the present invention will be described quantitatively below with reference to FIG. 19. In FIG. 19, only the last lens 115 of the liquid immersion object lens 112A is shown. Let nm be the refractive index of the mask substrate 108a and θm be the angle (subtended angle) of a diffracted ray D1 originating from the observed point and incident on the outermost circumference of the last lens 115 relative to the optical axis. Then, the numerical aperture NA, a characteristic that affects the resolution, of the liquid immersion object lens 112A is expressed by the equation (1):

$$NA = nm \times \sin \theta m. \quad (1)$$

The diffracted ray D1 is refracted when travelling from the mask substrate 108a into the pure water 114. Let nw be the refractive index of the pure water 114 and θw be the refracting angle. Then, the equation (2) holds true:

$$nm \times \sin \theta m = nw \times \sin \theta w. \quad (2)$$

With the angles θm and θw, the thickness tm of the mask substrate 108a, and the thickness tw of the pure water 114, the minimum radius R necessary for the last lens 115 is obtained from the equation (3):

$$R = tm \times \tan \theta m + tw \times \tan \theta w. \quad (3)$$

For example, if a liquid immersion object lens 112A having an NA of 1.0 is used, by substituting the refractive index of the mask substrate 108a (synthetic quartz) at a wavelength of 193 nm=1.56077, the refractive index of the pure water 114=1.436, the thickness tm of the mask substrate 108a=6.35 mm, and the thickness tw of the pure water 114=1.0 mm, R=6.27 mm is obtained. This is the minimum radius necessary for the last lens 115. There needs to be a margin of about 2 mm around the last lens 115 for lens support. Thus, considering the outer size of the body around the last lens 115 (indicated by X in FIG. 19, part that has to be excluded from the steps), the value of R+X needs to be about 9 mm or greater. This length R+X is much smaller than the width of 24 mm outside the pattern area 108e of the mask 108 shown in FIGS. 18A and 18B. Therefore, where the object lens 112A is placed below the mask 108, the claws 150a, 150c of the arm can be located between the step 140 and the mask substrate 108a.

Thus, in the photomask inspection apparatus 100, the scan direction of the mask 108 is in such a direction that the step 140 of the liquid immersion object lens 112A is located under the part of 24 mm in width outside the pattern area 108e as indicated by an arrow in FIG. 18A. On the other hand, if the mask is scanned in such a direction that the step of the liquid immersion object lens 112A is located under the part of 10 mm in width outside the pattern area 108e (that is, a left-right direction in FIG. 18A), the step will go outside the mask 108 and there will be no space for the claws of the arm to be inserted under the mask substrate 108a.

As described above, in the present embodiment, because the steps 140 are made in the body 112a of the object lens 112A, when the liquid immersion object lens 112A comes into a position where to observe an edge of the pattern area 108e, the claws 150a, 150b, 150c, 150d of the arm can be inserted into the steps 140 with supporting the mask 108. Therefore, in the liquid immersion photomask inspection apparatus, where the object lens is placed below the mask, the entire pattern area of the mask can be inspected.

Figure 21A:
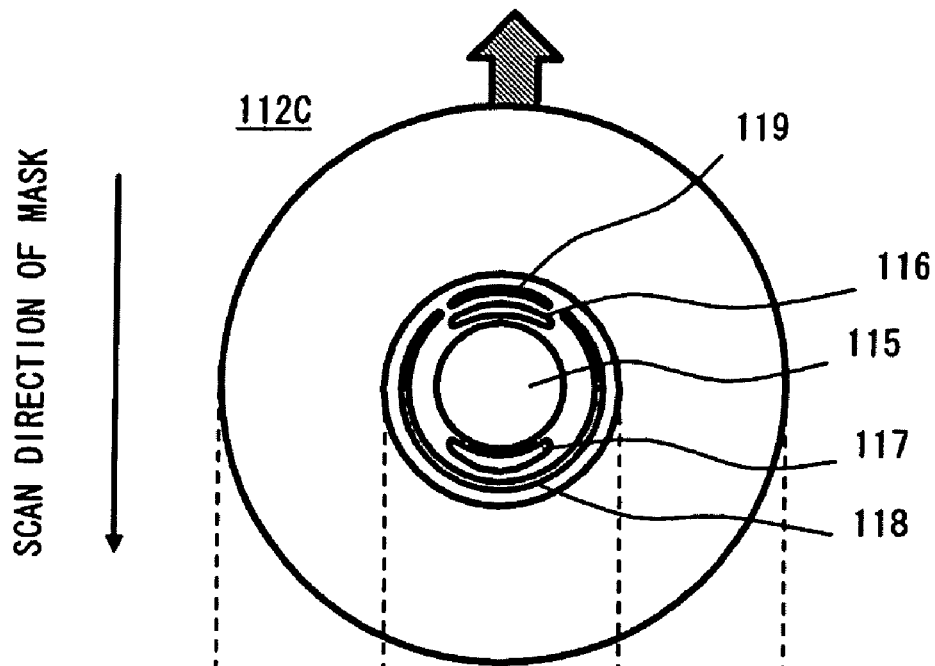
FIGS. 21A and 21B show the configuration of an object lens used in the present invention.
Figure 21B:
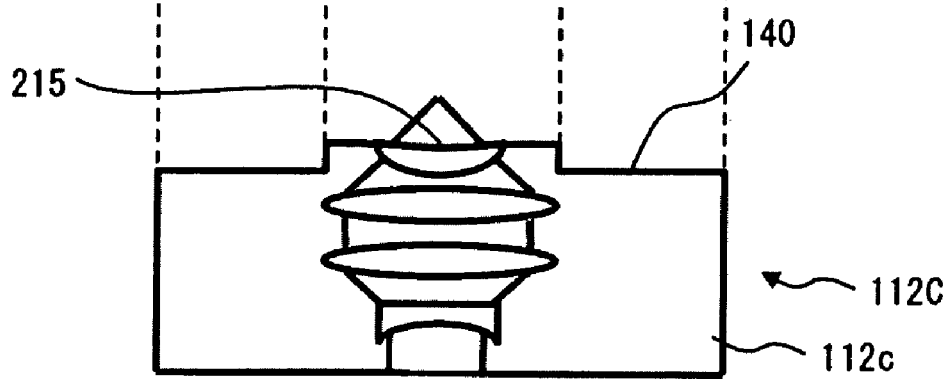
Figure 22:
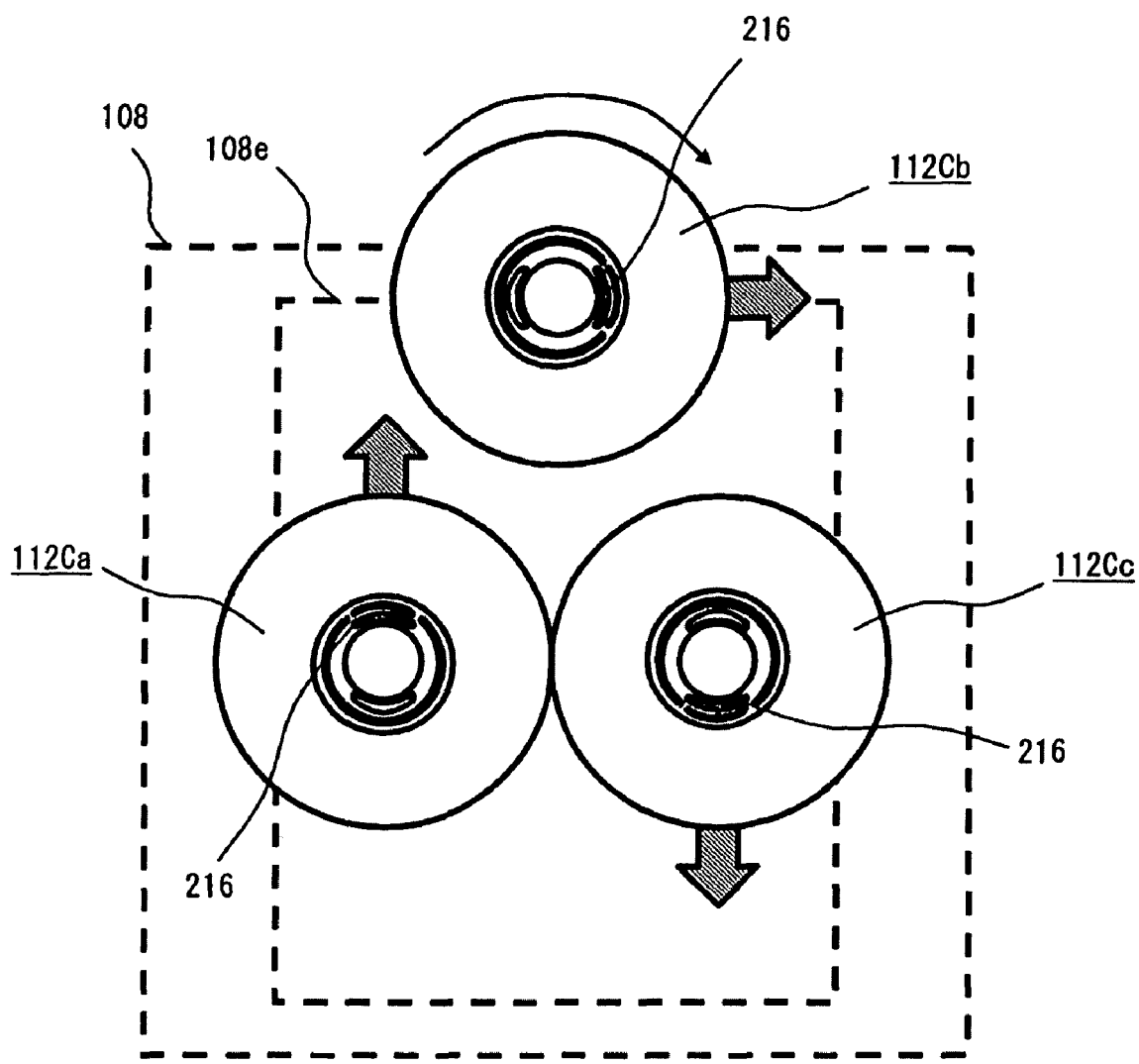
FIG. 22 shows example movements of the object lens of FIG. 21A.

Another example of the liquid immersion object lens used in the photomask inspection apparatus 100 of FIG. 16 will be described with reference to FIGS. 21A, 21B and 22. FIGS. 21A and 22B show an object lens 112C different in structure from the object lens 112A of FIGS. 17A and 17B. FIG. 21A is a view of the object lens 112C as seen from above (from the last lens 115 side), and FIG. 21B is a sectional view thereof. FIG. 22 shows the relative position of the object lens 112C to the mask 108. Since the components of the photomask inspection apparatus other than the object lens 112C are the same as in FIG. 16, description thereof will be omitted. Only the structure related to the supply and retrieval of pure water of the object lens 112C will be described. In FIGS. 21A, 21B, the same reference numerals indicate the same components as in the object lens 112A of FIGS. 17A, 17B with description thereof being omitted.

The last lens 115 is provided in the center of the top of the object lens 112C as shown in FIGS. 21A, 21B. The pure water supply port 116 is provided upstream in the scan direction of the mask near the last lens 115. The pure water supply port 116 is in a shape laterally extending and round along the outline of the last lens 115 so as to be locatable adjacent to the circular last lens 115. In the example of FIG. 21A, the mask is scanned downwards relative to the object lens 112C in the plane of the page. That is, the object lens 112C moves upwards relative to the mask 108 as indicated by the broad arrow. As a result, pure water discharged from the pure water supply port 116 flows over the entire last lens 115.

Pure water in contact with the last lens 115 moves away from the last lens 115 as the mask 108 moves and is sucked into a first pure water sucking port 117. A small amount of pure water that could not be sucked into the sucking port 117 is sucked into a second pure water sucking port 118, which is shaped like a long arc surrounding the first pure water sucking port 117 and the last lens 115. The pure water can be all retrieved during the scan of the mask with the help of the second pure water sucking port 118.

The liquid immersion object lens 112C of the present example differs from the liquid immersion object lens 112A of FIG. 17A in that it has only one pure water supply port 116. In this example, when the scan direction of the mask 108 changes, the liquid immersion object lens 112C rotates so that the pure water supply port 116 is always located upstream in the movement direction of the liquid immersion object lens 112C relative to the mask. That is, as shown in FIG. 22, the orientation of the object lens 112C changes from 112Ca to 112Cb to 112Cc.

As described above, in the present example, the liquid immersion object lens 112C is rotatably attached so as to be able to change its orientation according to the scan direction of the mask. By this means, only one pure water supply port 116 is needed, and thus the structure of the pure water supply and suction part of the liquid immersion object lens 112C is simplified.

Further, according to the present example, its orientation can be set to be in not only a direction (a vertical direction in FIG. 22) parallel to the scan direction of the mask as indicated by the 112Ca and 112Cc in FIG. 22 but also in a lateral or oblique direction. That is, during the lateral or oblique movement of the mask as well as the vertical scan movement, the liquid immersion object lens 112C can operate in liquid immersion.

As shown in FIG. 21A, a dry air outlet 119 is provided in the object lens 112C. By this means, pure water discharged from the pure water supply port 116 can be prevented from flowing to a great distance into the other side of the entire last lens 115. That is, while pure water is being discharged from the pure water supply port 116, dry air ejected from the dry air outlet 119 can push back the pure water. In particular, because the way that the pure water spreads can be controlled by the ejection of dry air, the pure water discharged from the pure water supply port 116 can be prevented from flowing to a great distance into the other side of the entire last lens 115 even when the mask is stationary, not being scanned. Therefore, also while the mask 108 is stopped and a review function to observe a particular portion is being used, the liquid immersion object lens 112C can operate in liquid immersion.

Embodiment 8

Figure 23A:
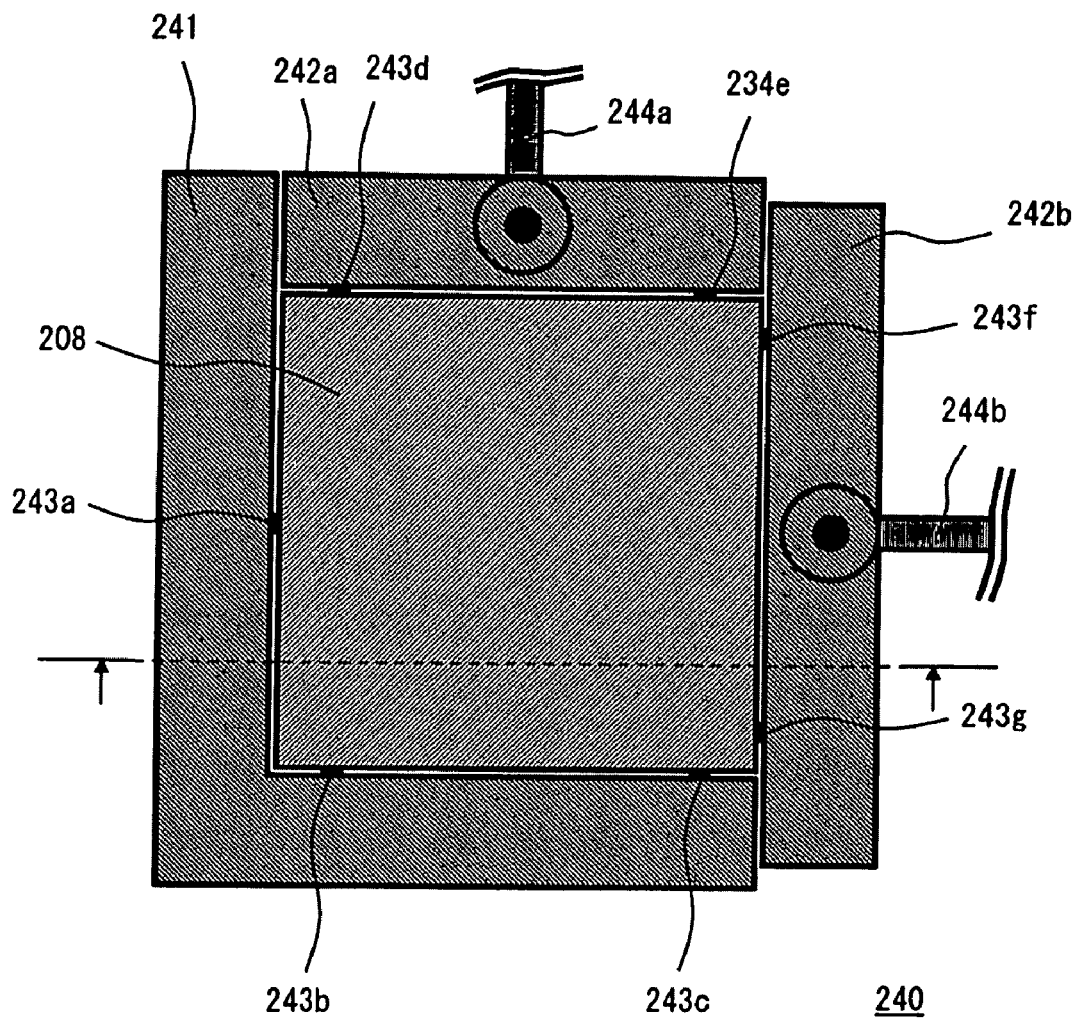
FIGS. 23A and 23B show the configuration of a mask fixing mechanism of a photomask inspection apparatus according to embodiment 8.
Figure 23B:
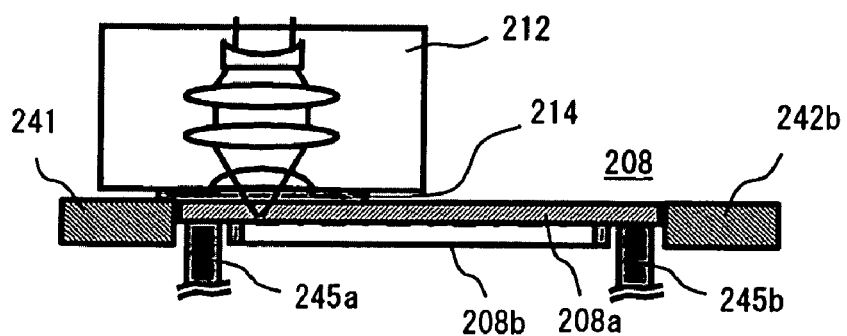

A photomask inspection apparatus according to embodiment 8 of the present invention will be described with reference to FIGS. 23A and 23B. FIGS. 23A and 23B show the configuration of a mask fixing mechanism of a photomask inspection apparatus according to the present embodiment. FIG. 23A is a view of the mask fixing mechanism as seen from above, and FIG. 23B is a side view thereof.

As described previously, the inventors invented a liquid immersion photomask inspection apparatus configured to observe the pattern surface from the back surface side of the mask substrate so that the liquid immersion technique can be applied. However, there is the following other problem with the liquid immersion photomask inspection apparatus. Whereas shown in FIG. 2 the object lens 212 is placed above the mask 208, when an edge of the pattern surface 208c of the mask 208 is observed, if liquid immersion water goes outside the mask substrate 208a, it may flow around to the opposite side to the liquid immersion surface of the mask substrate 208a to wet the pellicle 208b.

A mask fixing mechanism 240 effective in achieving the configuration of the photomask inspection apparatus of the present invention where the liquid immersion object lens is placed above the mask will be described with reference to FIGS. 23A and 23B. The mask fixing mechanism 240 comprises an L-shaped fixing plate 241, fixing plates 242a, 242b, pads 243a to 243g, and arms 244a, 244b.

The L-shaped fixing plate 241 and fixing plates 242a, 242b are made of fluorine resin because it is hydrophobic. The L-shaped fixing plate 241 is provided at contact points with the mask 208 with the pads 243a, 243b, 243c. The fixing plate 242a is provided at contact points with the mask 208 with the pads 243d, 243e. The fixing plate 242b is provided at contact points with the mask 208 with the pads 243f, 243g. The arms 244a, 244b are attached to the middle of the fixing plates 242a, 242b respectively and are movable and somewhat rotatable. The thickness of pads 243a to 243g is as very thin as about 0.1 mm. That is, the distance between the mask 208, and the L-shaped fixing plate 241 and the fixing plates 242a, 242b is about 0.1 mm.

When the mask 208 is set in the photomask inspection apparatus of the present invention to inspect, the mask 208 is pushed in two orthogonal directions to be positioned relative to the L-shaped fixing plate 241. To be specific, in FIG. 23A, the mask 208 is pushed against the two thin pads 243b, 243c attached to the L-shaped fixing plate 241 downwards by the fixing plate 242a with the two thin pads 243d, 243e attached to the fixing plate 242a in contact with the mask 208. Meanwhile, in FIG. 23A, the mask 208 is pushed against the thin pad 243a attached to the L-shaped fixing plate 241 in the right-to-left direction by the fixing plate 242b with the two thin pads 243f, 243g attached to the fixing plate 242b in contact with the mask 208.

As shown in FIG. 23B, the tops of the L-shaped fixing plate 241 and the fixing plates 242a, 242b are substantially the same in height as the top of the mask substrate 208a of the mask 208. Hence, when going outside the mask 208, the liquid immersion object lens 212 does not interfere with the L-shaped fixing plate 241 or the fixing plate 242a, 242b.

As described above, the L-shaped fixing plate 241 and fixing plates 242a, 242b are made of hydrophobic fluorine resin, and the thickness of pads 243a to 243g is as very thin as about 0.1 mm. Hence, even if pure water spilt over the mask 208 spreads to the L-shaped fixing plate 241 or the fixing plate 242a, 242b, it does not drop through those gaps. Thus, when the liquid immersion object lens 212 is located over an edge of the pattern area of the mask 208, the pure water 214 from the liquid immersion object lens 212 does not drop off the mask 208. Therefore, liquid immersion water from the liquid immersion object lens 212 can be prevented from flowing around to the pellicle 208b side of the mask 208.

Figure 24:
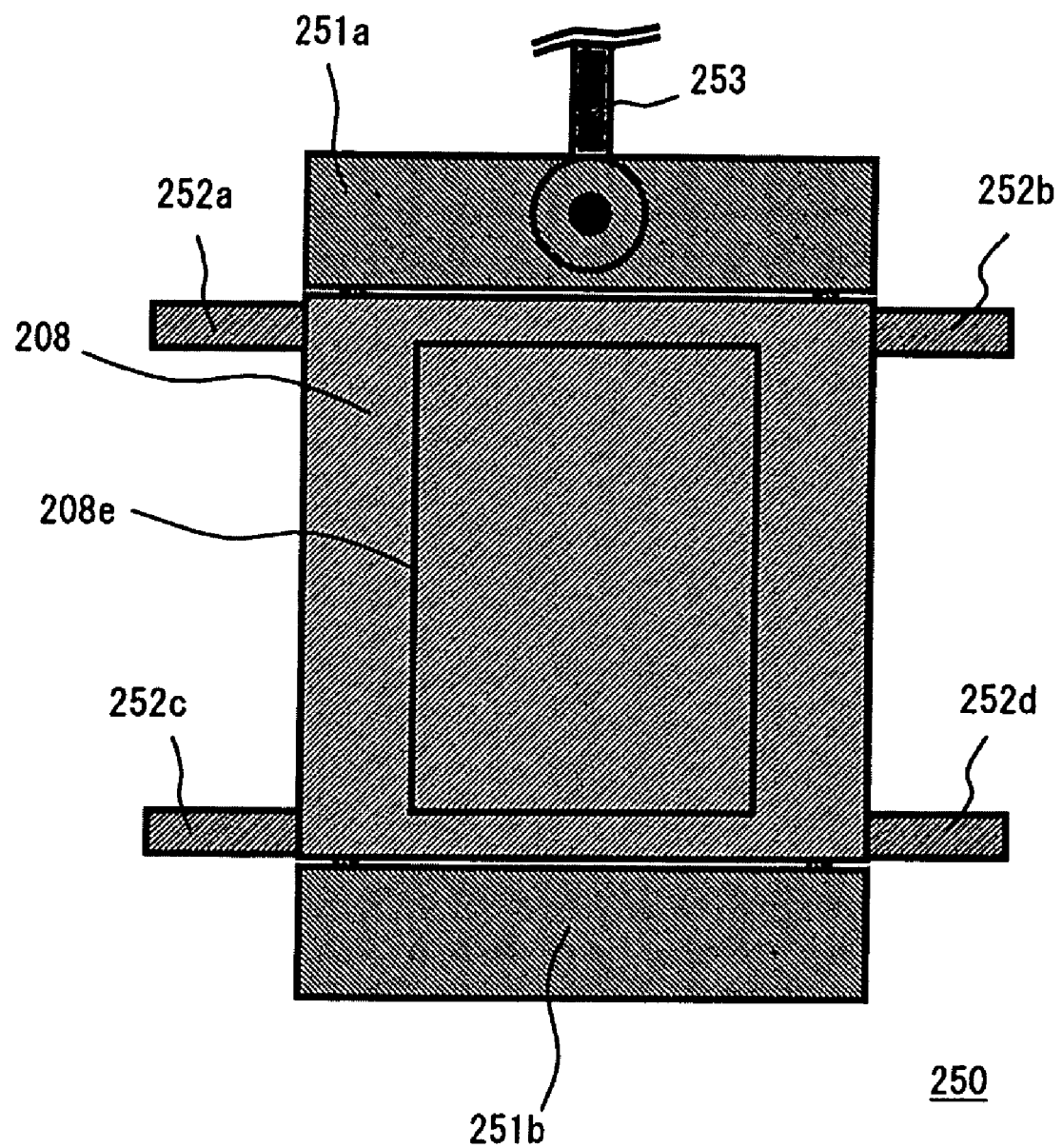
FIG. 24 shows another example configuration of the mask fixing mechanism.

FIG. 24 shows an example of another mask fixing mechanism 250 that is a further simplified version of the mask fixing mechanism 240 of FIG. 23A, 24B. As shown in FIG. 24, in the mask fixing mechanism 250, pure water receiving plates 251a, 251b are attached to short sides of the rectangular mask 208. That is, the pure water receiving plates 251a, 251b are located adjacent to the mask 208 to receive pure water going outside the mask 208. An arm is attached to the middle of the pure water receiving plate 251a, and the mask 208 is pushed against the pure water receiving plate 251b downwards by the pure water receiving plate 251a. The mask 208 is fixed and supported by claws 252a to 252d of an arm at four corners.

Where the liquid immersion object lens 212 is placed above the mask 208 as in the present example, not only pure water but also the mask 208 itself may be lifted by the suction by pure water sucking ports provided in the underside of the liquid immersion object lens 212. Accordingly, in the present example, as shown in FIG. 23B, the mask 208 is pulled down by vacuum sucking tubes 245a, 245b (actually four tubes at four corners of the mask 208), and thereby the mask 208 is not lifted.

Figure 25A:
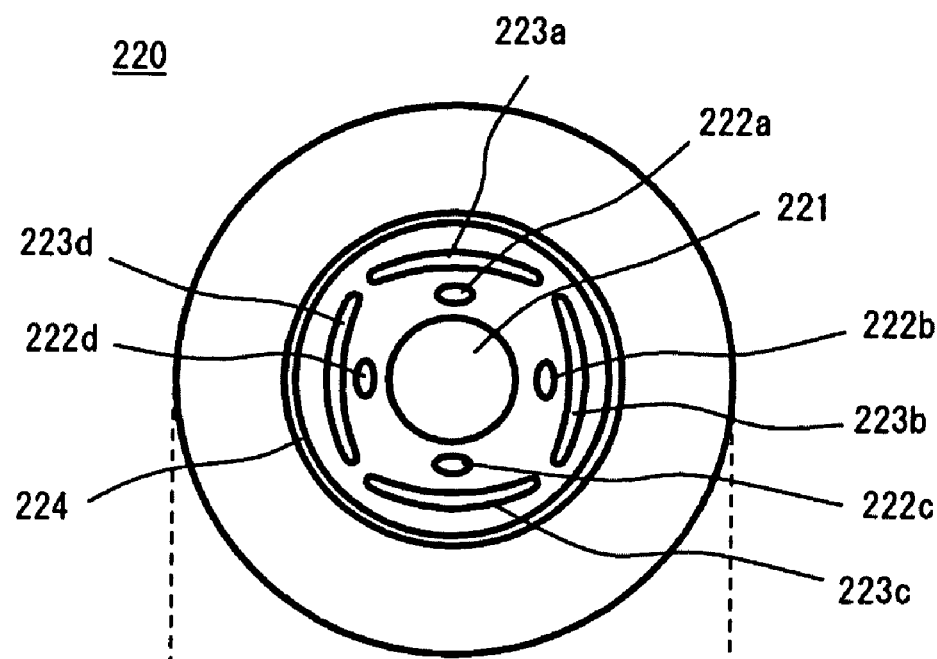
FIGS. 25A and 25B show the configuration of an object lens used in the present invention.
Figure 25B:
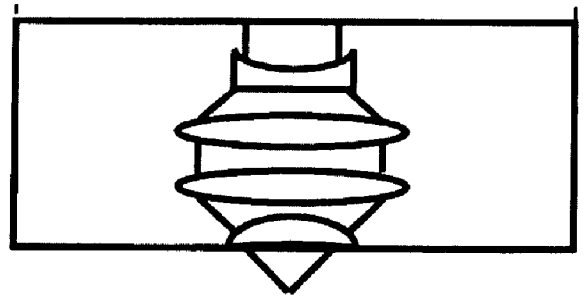

Since the object lens 212 is placed above the mask 208 as shown in FIG. 23B, the steps 140 as shown in FIGS. 17B and 21B need not be provided. As a result, multiple pure water supply ports and pure water sucking ports can be provided in the lower surface of the liquid immersion object lens in which surface the last lens is provided. Another example of the liquid immersion object lens will be described with reference to FIGS. 25A and 25B. FIGS. 25A and 25B shows the configuration of an object lens 220 used in the present embodiment.

As shown in FIG. 25A, an last lens 221 is provided in the center of the lower surface of the object lens 220. Four pure water supply ports 222a to 222d are provided around the last lens 221. Four first pure water sucking ports 223a to 223d corresponding to the pure water supply ports 222a to 222d are provided outward of the pure water supply ports 222a to 222d. Because the pure water supply ports 222a to 222d and first pure water sucking ports 223a to 223d are provided at four places respectively, four scan directions of the mask 208 can be covered. That is, in the movement in each direction, pure water is supplied from one of the pure water supply ports 222a to 222d which is located upstream in the movement and is sucked into one of the pure water sucking ports 223a to 223d which is located downstream in the movement. A ring-shaped second sucking port 224 is provided surrounding the pure water supply ports 222a to 222d and the first pure water sucking ports 223a to 223d.

As described above, in the photomask inspection apparatus of the present invention, where the liquid immersion object lens is placed above the mask, multiple supply ports and sucking ports for liquid immersion water can be provided in the liquid immersion object lens. Hence, only the ports corresponding to the movement direction of the mask are operated without rotating the liquid immersion object lens.

However, when the mask is stopped and a particular portion is observed, pure water is preferably supplied from all the four pure water supply ports 222a to 222d a little each. By this means, pure water easily comes into contact with the entire surface of the last lens 221.

Figure 26A:
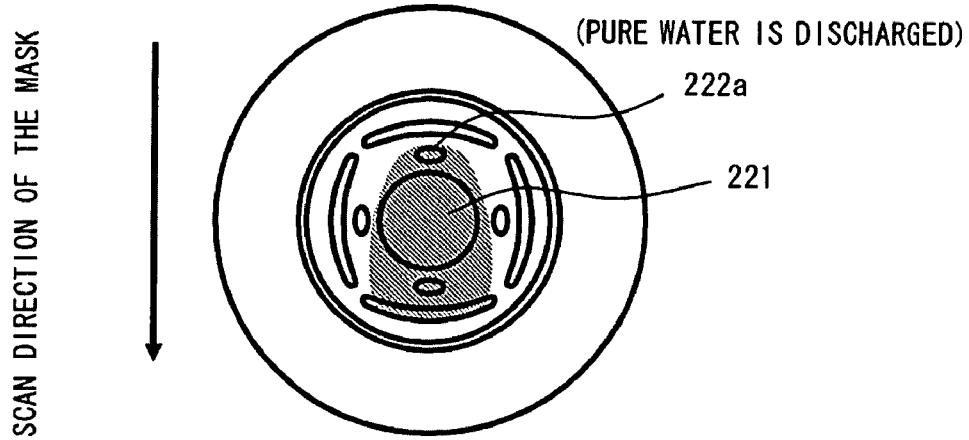
FIGS. 26A, 26B and 26C illustrate pure water supply operation at review with the object lens of FIG. 25A.
Figure 26B:
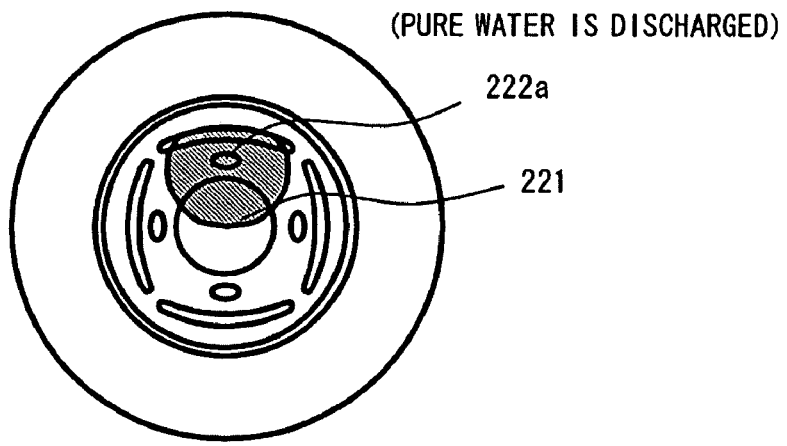
Figure 26C:
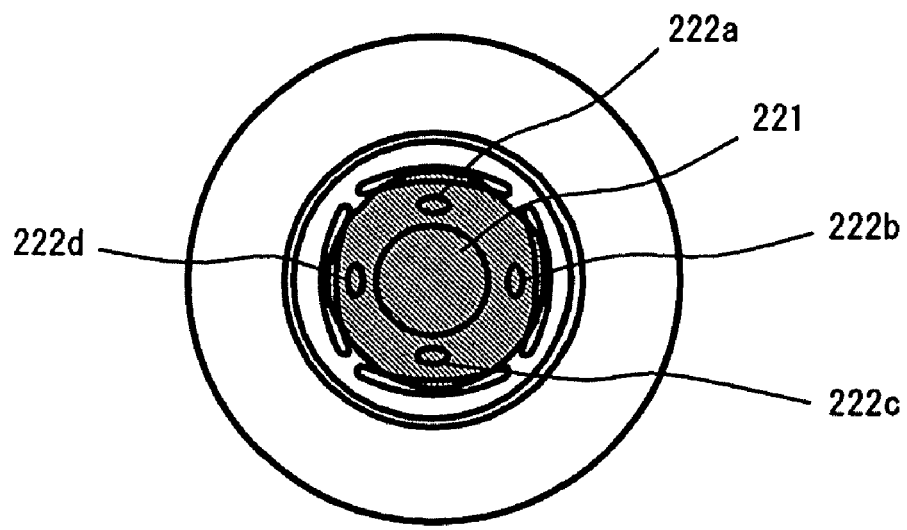

This will be described using FIGS. 26A-26C. FIGS. 26A-26C illustrate pure water supply operation at the review with the liquid immersion object lens 220. When a mask is scanned from top to bottom in the figure as shown in FIG. 26A, pure water is discharged from only the pure water supply port 222a of the liquid immersion object lens 220. Thereby, the shaded area in the figure and thus the entire surface of the last lens 221 are covered by pure water.

Meanwhile, in the review or the like at which time the mask is stopped, if pure water is discharged from only the pure water supply port 222a, only part of the last lens 221 may be covered as shown in FIG. 26B. In contrast, as shown in FIG. 26C, by all the four pure water supply ports 222a to 222d discharging pure water, the entire surface of the last lens 221 is covered by pure water when the mask 208 is stopped.

Although liquid immersion water used in the liquid immersion photomask inspection apparatus of the present invention is preferably pure water, ozone water may be used. Because ozone water is high in the capability of dissolving organic impurities, organic impurities sticking to the mask substrate can be dissolved during mask inspection. Thus, performing mask inspection also has the effect that the mask substrate is cleaned, thus preventing haze or the like that would otherwise occur on the mask substrate from occurring.

Concerning the liquid for the liquid immersion which is to be filled between the last lens and the rear surface of a mask substrate, diluted alcohol can be used instead of pure water. Alcohol, such as ethanol and methanol, has a refractive index of 1.61-1.62 at the wavelength of 193 nm. Pure water has a refractive index of 1.436 at the wavelength of 193 nm. Therefore refractive index of diluted alcohol which is mixture of alcohol and water can be equal to that of the material of the mask substrate. In this embodiment, quartz of about 1.56 in refractive index is used as the mask substrate, so refractive index of diluted alcohol can be about 1.56.

Using such diluted alcohol, optical length between the pattern surface of the mask substrate and the objective lens can be constant independently of the thickness variation of the mask substrate. Therefore some other solvent can also be used as far as its refractive index is equal to the refractive index of quartz.

Also in the case of using such refractive index adjusted liquid, an auto-focusing (AF) mechanism of the following technique can be used. A laser beam is supplied from the opposite side of the objective lens and is radiated on the surface of pattern side of the mask.

As described above, a practical liquid immersion photomask inspection apparatus is achieved by the photomask inspection apparatus according to the present invention, and hence 32 to 22 nm generations of lithography can be covered. Moreover, in the photomask inspection apparatus of the present invention, a high NA of 1 is achieved by the liquid immersion scheme, and even when optical simulation for exposure through a mask mounted in an exposure apparatus is performed with use of the review function to observe a particular area on the mask with the liquid immersion object lens of the present invention without scanning, the area can be observed with the high NA of 1, and hence optical simulation for the exposure by the liquid immersion exposure apparatus can be performed.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A photomask inspection apparatus which observes a pattern provided on a mask substrate of a mask to inspect the mask, comprising:
   an object lens; and
   a liquid that is present between an last lens in the side closer to the mask of the object lens and the mask,
   wherein the object lens is placed on the opposite side of the mask substrate from a pattern surface thereof.

2. The photomask inspection apparatus according to claim 1, wherein the object lens is placed above the mask and is provided with a supply unit to supply the liquid to a non-pattern surface of the mask substrate opposite to the pattern surface and a sucking unit to suck the liquid.

3. The photomask inspection apparatus according to claim 2, further comprising a plane plate positioned adjacent to at least two of four sides of the mask and substantially level with the non-pattern surface of the mask substrate of the mask.

4. The photomask inspection apparatus according to claim 1, wherein the object lens is placed below the mask.

5. The photomask inspection apparatus according to claim 4, wherein the object lens has an outlet to supply the liquid, and the outlet is provided upstream in a scan direction.

6. The photomask inspection apparatus according to claim 5, wherein a plurality of the outlets are provided at least upstream and downstream in the scan direction, and the object lens has a notch to drain the liquid in a direction perpendicular to the scan direction.

7. The photomask inspection apparatus according to claim 5, wherein the object lens has an inlet surrounding the outlet to suck in the liquid.

8. The photomask inspection apparatus according to claim 7, wherein the object lens has a gas outlet surrounding the inlet to discharge gas.

9. The photomask inspection apparatus according to claim 4, further comprising:
   a support to hold the mask,
   wherein a step corresponding in outline to the support is formed in the top of a body of the object lens.

10. The photomask inspection apparatus according to claim 9, wherein two of the steps are formed respectively in opposite sides of the top of the body of the object lens.

11. The photomask inspection apparatus according to claim 9, wherein the step is formed throughout the periphery of the top of the body of the object lens.

12. The photomask inspection apparatus according to claim 9, wherein a mask scan direction during inspection of the mask is parallel to a longitudinal direction of a maximum pattern area of the mask.

13. A photomask inspection apparatus which observes a pattern provided on a mask substrate of a mask to inspect the mask, comprising:
   an object lens; and
   a liquid that is present between an last lens in the side closer to the mask of the object lens and the mask,
   a container to contain the liquid,
   wherein the mask is placed in the container so that a surface of the mask opposite to a pattern surface thereof is in contact with the liquid,
   wherein the pattern surface facing upwards, the object lens is placed below the container, the inspection apparatus further comprising:
   a measuring unit for measuring the distance to the pattern surface of the mask in the container.

14. A photomask inspection apparatus which observes a pattern provided on a mask substrate of a mask to inspect the mask, comprising:
   an object lens; and
   a liquid that is present between an last lens in the side closer to the mask of the object lens and the mask,
   wherein the object lens is rotatably held so that when the mask and the object lens moves relatively to each other, the orientation of the object lens around its optical axis can be changed according to the direction of the movement.

* * * * *